(12) United States Patent
Ishizuka et al.

(10) Patent No.: US 8,247,308 B2
(45) Date of Patent: Aug. 21, 2012

(54) METHOD FOR MANUFACTURING SOI SUBSTRATE

(75) Inventors: Akihiro Ishizuka, Kanagawa (JP); Shinya Sasagawa, Kanagawa (JP); Motomu Kurata, Kanagawa (JP); Atsushi Hikosaka, Kanagawa (JP); Taiga Muraoka, Kanagawa (JP); Hitoshi Nakayama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 293 days.

(21) Appl. No.: 12/505,020

(22) Filed: Jul. 17, 2009

(65) Prior Publication Data
US 2010/0047997 A1 Feb. 25, 2010

(30) Foreign Application Priority Data
Jul. 22, 2008 (JP) ................... 2008-189015

(51) Int. Cl.
*H01L 21/30* (2006.01)
(52) U.S. Cl. .. 438/458; 438/455; 438/473; 257/E21.122
(58) Field of Classification Search .............. 438/455, 438/457, 458, 473–475; 257/E21.122, E21.567
See application file for complete search history.

(56) References Cited

U.S. PATENT DOCUMENTS

| | | | |
|---|---|---|---|
| 5,953,620 A | 9/1999 | Katou et al. | |
| 6,372,609 B1 | 4/2002 | Aga et al. | |
| 6,583,440 B2 | 6/2003 | Yasukawa | |
| 6,818,921 B2 | 11/2004 | Yasukawa | |
| 7,112,514 B2 | 9/2006 | Yasukawa | |
| 7,148,124 B1 * | 12/2006 | Usenko | 438/458 |
| 7,508,034 B2 | 3/2009 | Takafuji et al. | |
| 2007/0026638 A1 * | 2/2007 | Henley | 438/459 |

(Continued)

FOREIGN PATENT DOCUMENTS
EP 1045448 10/2000
(Continued)

OTHER PUBLICATIONS

Mumola, P. B. et al., "Plasma thinned SOI bonded wafers", Proceedings 1992 IEEE International SOI Conference, Oct. 6, 1992, pp. 152-153.

*Primary Examiner* — Thanhha Pham
(74) *Attorney, Agent, or Firm* — Eric J. Robinson; Robinson Intellectual Property Law Office, P.C.

(57) ABSTRACT

It is an object of the preset invention to increase adhesiveness of a semiconductor layer and a base substrate and to reduce defective bonding. An oxide film is formed on a semiconductor substrate and the semiconductor substrate is irradiated with accelerated ions through the oxide film, whereby an embrittled region is formed at a predetermined depth from a surface of the semiconductor substrate. Plasma treatment is performed on the oxide film on the semiconductor substrate and the base substrate by applying a bias voltage, the surface of the semiconductor substrate and a surface of the base substrate are disposed opposite to each other, a surface of the oxide film is bonded to the surface of the base substrate, heat treatment is performed after the surface of the oxide film is bonded to the surface of the base substrate, and separation is caused along the embrittled region, whereby a semiconductor layer is formed over the base substrate with the oxide film interposed therebetween.

16 Claims, 24 Drawing Sheets

U.S. PATENT DOCUMENTS

| | | |
|---|---|---|
| 2007/0110917 A1 | 5/2007 | Okada |
| 2008/0038900 A1* | 2/2008 | Thakur et al. ............. 438/455 |
| 2008/0246109 A1 | 10/2008 | Ohnuma et al. |
| 2008/0286939 A1* | 11/2008 | Ohnuma ..................... 438/458 |
| 2008/0305317 A1 | 12/2008 | Ito et al. |
| 2009/0095956 A1 | 4/2009 | Takafuji et al. |
| 2009/0111236 A1 | 4/2009 | Kakehata et al. |
| 2009/0170287 A1 | 7/2009 | Endo et al. |
| 2009/0203191 A1 | 8/2009 | Ohnuma et al. |
| 2009/0325363 A1 | 12/2009 | Ohnuma et al. |

FOREIGN PATENT DOCUMENTS

| | | |
|---|---|---|
| EP | 1981064 | 10/2008 |
| JP | 2000-124092 | 4/2000 |
| JP | 2002-170942 | 6/2002 |
| JP | 2004-134675 | 4/2004 |
| JP | 2005-294800 | 10/2005 |

* cited by examiner

METHOD FOR MANUFACTURING SOI SUBSTRATE

BACKGROUND OF THE INVENTION

1. Field of the Invention

The present invention relates to a method for manufacturing a substrate provided with a semiconductor layer with an insulating film interposed therebetween, especially, a silicon-on-insulator (SOI) substrate. The present invention also relates to a method for manufacturing a semiconductor device using a substrate provided with a semiconductor layer with an insulating film interposed therebetween.

2. Description of the Related Art

In recent years, integrated circuits have been developed which use a silicon-on-insulator (SOI) substrate in which a thin single crystal semiconductor layer is present over an insulating surface, instead of a bulk silicon wafer. The use of an SOI substrate can reduce parasitic capacitance between a drain of a transistor and a substrate; thus, SOI substrates are attracting attention for their ability to improve performance of semiconductor integrated circuits.

One of known methods for manufacturing SOI substrates is a Smart Cut (registered trademark) method (for example, see Patent Document 1). A summary of a method for manufacturing an SOI substrate by a Smart Cut method is described below. First, hydrogen ions are implanted into a silicon wafer by an ion implantation method to form an embrittled region at a predetermined depth from a surface. Next, the silicon wafer into which hydrogen ions have been implanted is bonded to another silicon wafer with a silicon oxide film interposed therebetween. Then, by heat treatment, a part of the silicon wafer into which hydrogen ions have been implanted is separated in a thin film shape along the embrittled region. Accordingly, a single crystal silicon film can be formed over the other bonded silicon wafer. Moreover, the Smart Cut method is also referred to as a "hydrogen ion implantation separation method".

Further, a method for forming a single crystal silicon layer over a base substrate made from glass by using such a Smart Cut method as described above has been proposed (for example, see Patent Document 2). Glass substrates can be manufactured in larger sizes and are less expensive than silicon wafers. Thus, glass substrates are mainly used for manufacturing liquid crystal display devices and the like. The use of a glass substrate as a base substrate makes it possible to manufacture a large-sized inexpensive SOI substrate.

CITATION LIST

[Patent Document 1] Japanese Published Patent Application No. 2000-124092

[Patent Document 2] Japanese Published Patent Application No. 2002-170942

SUMMARY OF THE INVENTION

In a process for bonding a single crystal silicon substrate to a base substrate, many voids are generated at a bonding interface due to unevenness and particles on the surface of the base substrate made from glass, which leads to increase in defective bonding. In addition, if unevenness and particles are present, hydrogen bonding hardly occurs at the bonding interface and bonding strength between the base substrate and the single crystal silicon substrate is insufficient.

If there frequently occurs such defective bonding, bonding strength decreases and there is a concern that a thin single crystal silicon layer may come to be peeled off at the bonding interface between the glass substrate that functions as the base substrate and the thin single crystal silicon layer that has been separated. Further, also in manufacturing a semiconductor device, such defective bonding hinders manufacture of a semiconductor device with high quality.

In view of the above problems, it is an object of one embodiment of the present invention to improve adhesiveness between a single crystal semiconductor layer and a base substrate, and to suppress defective bonding. Further, it is another object to provide a method for manufacturing an SOI substrate having sufficient bonding strength in a bonding step and also in a process for manufacturing a semiconductor device.

In one embodiment of the present invention, an oxide film is formed on a semiconductor substrate side, and plasma treatment is performed on a base substrate side, whereby the oxide film formed over the semiconductor substrate is bonded to the base substrate.

Further, another embodiment of the present invention is a method for manufacturing an SOI substrate including the steps of: forming an oxide film on a semiconductor substrate; forming an embrittled region in the semiconductor substrate by irradiating the semiconductor substrate with accelerated ions through the oxide film; performing plasma treatment on a base substrate by applying a bias voltage; disposing a surface of the semiconductor substrate and a surface of the base substrate opposite to each other; bonding a surface of the oxide film to the surface of the base substrate; performing heat treatment after the surface of the oxide film is bonded to the surface of the base substrate; causing separation along the embrittled region; and forming a semiconductor layer over the base substrate with the oxide film interposed therebetween.

Furthermore, another embodiment of the present invention is a method for manufacturing an SOI substrate including the steps of: forming an oxide film on a plurality of semiconductor substrates; forming an embrittled region in the plurality of semiconductor substrates by irradiating the plurality of semiconductor substrates with accelerated ions through the oxide film; performing plasma treatment on a base substrate by applying a bias voltage; disposing surfaces of the plurality of semiconductor substrates and a surface of the base substrate opposite to each other; bonding a surface of the oxide film to the surface of the base substrate; performing heat treatment after the surface of the oxide film is bonded to the surface of the base substrate; causing separation along the embrittled region; and forming a plurality of semiconductor layers over the base substrate with the oxide film interposed therebetween.

It is preferable that the plasma treatment be performed by inductively coupled plasma (ICP) etching.

Moreover, another embodiment of the present invention is a method for manufacturing an SOI substrate including the steps of: forming an oxide film on a semiconductor substrate; forming an embrittled region in the semiconductor substrate by irradiating the semiconductor substrate with accelerated ions through the oxide film; performing first plasma treatment on a base substrate by applying a first bias voltage; forming a nitrogen-containing layer over the base substrate subjected to the first plasma treatment; performing second plasma treatment on at least one of the oxide film on the semiconductor substrate and the nitrogen-containing layer over the base substrate by applying a second bias voltage; disposing a surface of the semiconductor substrate and a surface of the base substrate opposite to each other; bonding a surface of the oxide film to a surface of the nitrogen-containing layer; performing heat treatment after the surface of the oxide film is bonded to the surface of the nitrogen-containing layer; causing separation along the embrittled region; and forming a semiconductor layer over the base substrate with the nitrogen-containing layer and the oxide film interposed therebetween.

In addition, another embodiment of the present invention is a method for manufacturing an SOI substrate including the steps of: forming an oxide film on a plurality of semiconductor substrates; forming an embrittled region in the plurality of semiconductor substrates by irradiating the plurality of semiconductor substrates with accelerated ions through the oxide film; performing first plasma treatment on a base substrate by applying a first bias voltage; forming a nitrogen-containing layer over the base substrate subjected to the first plasma treatment; performing second plasma treatment on at least one of the oxide film on the plurality of semiconductor substrates and the nitrogen-containing layer over the base substrate by applying a second bias voltage; disposing surfaces of the plurality of semiconductor substrates and a surface of the base substrate opposite to each other; bonding a surface of the oxide film to a surface of the nitrogen-containing layer; performing heat treatment after the surface of the oxide film is bonded to the surface of the nitrogen-containing layer; causing separation along the embrittled region; and forming a plurality of semiconductor layers over the base substrate with the nitrogen-containing layer and the oxide film interposed therebetween.

It is preferable that the first plasma treatment be performed by inductively coupled plasma etching, and the second plasma treatment be performed by reactive ion etching in the above-described manufacturing steps.

Further, still another embodiment of the present invention is a method for manufacturing an SOI substrate including the steps of: forming an oxide film on a semiconductor substrate; forming an embrittled region in the semiconductor substrate by irradiating the semiconductor substrate with accelerated ions through the oxide film; forming a nitrogen-containing layer over a base substrate; performing first plasma treatment on at least one of the oxide film on the semiconductor substrate and the nitrogen-containing layer over the base substrate by applying a first bias voltage; disposing a surface of the semiconductor substrate and a surface of the base substrate opposite to each other; bonding a surface of the oxide film to a surface of the nitrogen-containing layer; performing heat treatment after the surface of the oxide film is bonded to the surface of the nitrogen-containing layer; causing separation along the embrittled region; and forming a semiconductor layer over the base substrate with the oxide film and the nitrogen-containing layer interposed therebetween.

Furthermore, yet another embodiment of the present invention is a method for manufacturing an SOI substrate including the steps of: forming an oxide film on a plurality of semiconductor substrates; forming an embrittled region in the plurality of semiconductor substrates by irradiating the plurality of semiconductor substrates with accelerated ions through the oxide film; forming a nitrogen-containing layer over a base substrate; performing first plasma treatment on at least one of the oxide film on the plurality of semiconductor substrates and the nitrogen-containing layer over the base substrate by applying a first bias voltage; disposing surfaces of the plurality of semiconductor substrates and a surface of the base substrate opposite to each other; bonding a surface of the oxide film to a surface of the nitrogen-containing layer; performing heat treatment after the surface of the oxide film is bonded to the surface of the nitrogen-containing layer; causing separation along the embrittled region; and forming a semiconductor layer over the base substrate with the nitrogen-containing layer and the oxide film interposed therebetween.

It is preferable that the first plasma treatment be performed by inductively coupled plasma etching in the above-described manufacturing steps.

For a nitrogen-containing layer, silicon oxynitride or silicon nitride oxide can be used. In this specification, silicon oxynitride contains more oxygen than nitrogen and, in the case where measurements are performed using rutherford backscattering spectrometry (RBS) and hydrogen forward scattering (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are performed using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

As the base substrate, a substrate made from an insulator is used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate.

The term "single crystal" means a crystal in which, when a certain crystal axis is focused, the direction of the crystal axis is oriented in the same direction in any portion of a sample and which has no crystal grain boundaries between crystals. Note that, in this specification, the single crystal includes a crystal in which the direction of crystal axes is uniform and which has no grain boundaries as described above even when it includes a crystal defect or a dangling bond.

The term "semiconductor device" in this specification refers to devices in general which can operate by utilizing semiconductor characteristics, and an electro-optical device, a semiconductor circuit, and an electronic device are all included in the semiconductor device.

In addition, the term "display device" in this specification includes a light emitting device and a liquid crystal display device. A light emitting device includes a light emitting element, and a liquid crystal display device includes a liquid crystal element. A light emitting element includes, in its scope, an element whose luminance is controlled by current or voltage, and specifically includes an inorganic electroluminescent (EL) element, an organic EL element, and the like.

According to one embodiment of the present invention, an SOI substrate can be manufactured in which adhesiveness between a semiconductor layer and a base substrate is improved; defective bonding is suppressed; and sufficient bonding strength is provided in a bonding step and also in a process for manufacturing a semiconductor device.

BRIEF DESCRIPTION OF THE DRAWINGS

In the accompanying drawings:

FIGS. 2A-1 to 2A-4, 2B-1 to 2B-3, 2C, and 2D are diagrams illustrating an example of a method for manufacturing an SOI substrate according to one embodiment of the present invention;

FIGS. 22A-1 to 22A-4, 22B-1 to 22B-3, 22C, and 22D are diagrams illustrating an example of a method for manufacturing an SOI substrate according to one embodiment of the present invention;

DETAILED DESCRIPTION OF THE INVENTION

Figures 1, 1A:
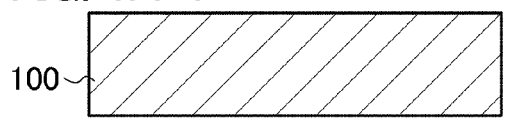
FIGS. 1A-1 to 1A-4, 1B-1 and 1B-2, 1C, and 1D are diagrams illustrating an example of a method for manufacturing an SOI substrate according to one embodiment of the present invention.

Embodiments of the present invention will be described below with reference to the accompanying drawings. Note that it is easily understood by those skilled in the art that the present invention can be implemented in many different modes and modes and details can be modified in a variety of ways without departing from the purpose and scope of the present invention. Therefore, the present invention should not be construed as being limited to the description below of the embodiments. Note that reference numerals indicating the same portions and portions having a similar function are used in common in all drawings describing the embodiments, and repeated descriptions thereof are omitted.

Embodiment 1

In this embodiment, a method for manufacturing a substrate provided with a semiconductor layer with an insulating film interposed therebetween (for example, an SOI substrate) by bonding a semiconductor substrate to a base substrate is described with reference to drawings.

First, a semiconductor substrate 100 is prepared (see FIG. 1A-1).

As the semiconductor substrate 100, a single crystal semiconductor substrate or a polycrystalline semiconductor substrate can be used, and examples thereof include a single crystal silicon substrate, a polycrystalline silicon substrate, a germanium substrate, compound semiconductor substrates of gallium arsenide, indium phosphide, and the like. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape is not limited to a circular shape, and a silicon substrate processed into a rectangular shape or the like can also be used. A case in which a single crystal silicon substrate is used as the semiconductor substrate 100 is described below.

Note that it is preferable that a surface of the semiconductor substrate 100 be appropriately cleaned in advance with a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), ozone water, or the like in light of removal of contamination. Alternatively, dilute hydrofluoric acid and ozone water may be discharged alternately for cleaning.

Figures 1, 1A, 2:
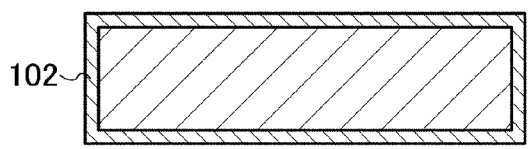

Next, an oxide film 102 is formed over the surface of the semiconductor substrate 100 (see FIG. 1A-2).

As the oxide film 102, for example, a single layer of a silicon oxide film, a silicon oxynitride film, or the like, or a stacked layer thereof can be used. These films can be formed by a thermal oxidation method, a CVD method, a sputtering method, or the like. Further, in the case where the oxide film 102 is formed by a CVD method, it is preferable that a silicon oxide film which is formed by a CVD method using organosilane such as tetraethoxysilane (abbreviation: TEOS) (chemical formula: $Si(OC_2H_5)_4$) be used as the oxide film 102 in light of productivity.

In this embodiment, the semiconductor substrate 100 is subjected to thermal oxidation treatment to form the oxide film 102 (here, an $SiO_x$ film) (see FIG. 1A-2). The thermal oxidation treatment is preferably performed in an oxidizing atmosphere to which a halogen is added.

For example, the semiconductor substrate 100 is subjected to thermal oxidation treatment in an oxidizing atmosphere to which chlorine (Cl) is added, thereby forming the oxide film 102 that is oxidized with HCl. Thus, the oxide film 102 contains chlorine atoms.

The chlorine atoms contained in the oxide film 102 form distortions. As a result, absorption of moisture into the oxide film 102 is improved and diffusion rate is increased. That is, when moisture is present on a surface of the oxide film 102, the moisture present on the surface of the oxide film 102 can be rapidly absorbed and diffused into the oxide film 102. By utilizing such an oxide film as a bonding layer, bonding strength with the base substrate can be increased.

As an example of thermal oxidation treatment, thermal oxidation may be performed in an oxidizing atmosphere which contains hydrogen chloride (HCl) at a proportion of 0.5 vol. % to 10 vol. % (preferably, 2 vol. %) with respect to oxygen at a temperature of 900° C. to 1150° C. (for example, 1000° C.). Treatment time may be set to 0.1 to 6 hours, preferably, 0.5 to 1 hour. The thickness of an oxide film to be formed is set to 10 nm to 1000 nm (preferably, 50 nm to 300 nm), for example, 100 nm.

As another example of thermal oxidation treatment, thermal oxidation may be performed in an oxidizing atmosphere which contains trans-1,2-dichloroethylene (DCE) at a proportion of 0.25 vol. % to 5 vol. % (preferably, 3 vol. %) with respect to oxygen at a temperature of 700° C. to 1150° C. (typically, 950° C.). Treatment time may be set to 0.1 to 6 hours, preferably, 0.5 to 1 hour. The thickness of an oxide film to be formed is set to 10 nm to 1000 nm (preferably, 50 nm to 300 nm), for example, 100 nm. Because trans-1,2-dichloroethylene is thermally decomposed at low temperature, thermal oxidation treatment can be performed at lower temperature than a case where thermal oxidation treatment is performed using hydrogen chloride. In particular, in the case where a semiconductor substrate is repeatedly reused, by reducing temperature for thermal oxidation treatment, productivity can be improved and thermal shock can be reduced. Note that, instead of trans-1,2-dichloroethylene, cis-1,2-dichloroethylene, 1,1-dichloroethylene, or a mixed gas of two or more of these gases may be used.

In this embodiment, the concentration of chlorine atoms included in the oxide film 102 is controlled to $1 \times 10^{17}$ atoms/cm³ to $1 \times 10^{21}$ atoms/cm³.

In addition, the inclusion of chlorine atoms in the oxide film 102 is also effective in preventing contamination of the semiconductor substrate 100 by trapping heavy metal (such as Fe, Cr, Ni, Mo, and the like) which is an extrinsic impurity.

The inclusion of halogen such as chlorine in the oxide film 102 by HCl oxidation or the like makes it possible to perform gettering on an impurity (for example, movable ions such as Na) which gives an adverse effect on the semiconductor substrate. That is, by heat treatment which is performed after the oxide film 102 is formed, the impurity contained in the semiconductor substrate is separated out to the oxide film 102 and captured by reacting with the halogen (for example, chlorine). Accordingly, the impurity trapped in the oxide film 102 can be fixed and prevented from contaminating the semiconductor substrate 100. In addition, when bonded to a glass substrate, the oxide film 102 can also function as a film for neutralizing an impurity, such as Na, contained in glass.

Specifically, the inclusion of halogen, such as chlorine, in the oxide film 102 by HCl oxidation or the like is effective in removing contamination of the semiconductor substrate when cleaning of the semiconductor substrate is insufficient or when the semiconductor substrate is repeatedly reused.

The inclusion of hydrogen in a gas used for thermal oxidation treatment serves to repair defects at the interface between the semiconductor substrate 100 and the oxide film 102 and reduce localized state density at the interface. Thus, the oxide film 102 is preferably made to contain hydrogen atoms at $1 \times 10^{18}$ atoms/cm³ or more.

In above description, the case is described in which the oxide film 102 containing chlorine atoms is formed by thermal oxidation treatment in an oxidizing atmosphere containing hydrogen chloride or dichloroethylene. However, the present invention is not limited thereto. For example, the oxide film 102 (for example, $SiO_x$) may be formed on a surface of the semiconductor substrate 100 by thermal oxidation treatment in an oxidizing atmosphere, and then, the oxide film 102 may be made to contain chlorine atoms by addition of chlorine ions, which are accelerated by an electric field, with the use of an ion doping apparatus or an ion implantation apparatus. Furthermore, thermal oxidation treatment may be performed in an oxidizing atmosphere after surface treatment with an aqueous solution of hydrogen chloride (HCl).

Further, halogen to be contained in the oxide film 102 is not limited to chlorine atoms. The oxide film 102 may contain fluorine atoms. A surface of the semiconductor substrate 100 may be oxidized with fluorine by thermal oxidation treatment in an oxidizing atmosphere after immersion of the surface of the semiconductor substrate 100 into an HF solution or by thermal oxidation treatment in an oxidizing atmosphere to which $NF_3$ is added.

Next, the semiconductor substrate 100 is irradiated with ions having kinetic energy to form an embrittled region 104 having a damaged crystal structure at a predetermined depth in the semiconductor substrate 100 (see FIG. 1A-3). As illustrated in FIG. 1A-3, by irradiation of the semiconductor substrate 100 with accelerated ions 103 through the oxide film 102, the ions 103 are introduced to a region at a predetermined depth from a surface of the semiconductor substrate 100, whereby the embrittled region 104 can be formed. The ions 103 are obtained as follows: a source gas is excited to generate plasma of the source gas, and ions included in this plasma are extracted from the plasma by the action of an electric field and are then accelerated.

The depth of a region where the embrittled region 104 is formed can be adjusted by kinetic energy of the ions 103, ion species, and incident angle of the ions 103. Kinetic energy can be adjusted by acceleration voltage or the like. The embrittled region 104 is formed at a depth equal to or substantially equal to the average penetration depth of the ions 103. Thus, the thickness of a semiconductor layer separated from the semiconductor substrate 100 is determined by the depth to which the ions 103 are added. The depth at which the embrittled region 104 is formed is adjusted such that the thickness of this semiconductor layer is greater than or equal to 10 nm and less than or equal to 500 nm, preferably, greater than or equal to 50 nm and less than or equal to 200 nm. For example, in the case where the thickness of the semiconductor layer is set to 120 nm, ion irradiation may be performed such that the peak value of the profile of ions in a depth direction is 120 nm.

The embrittled region 104 can be formed by ion doping treatment. Ion doping treatment can be performed using an ion doping apparatus. A typical ion doping apparatus is a non-mass-separation apparatus with which an object placed in a chamber is irradiated with all ion species generated by excitation of a process gas into plasma. The apparatus is called a non-mass-separation apparatus because an object is irradiated with all ions species in plasma without mass separation. In contrast, an ion implantation apparatus is a mass-separation apparatus. An ion implantation apparatus is an apparatus with which an object is irradiated with an ion species having a specific mass after mass separation of ion species in plasma.

Main components of an ion doping apparatus are as follows: a chamber in which an object is placed; an ion source for generating desired ions; and an acceleration mechanism for acceleration of ions for irradiation therewith. The ion source includes a gas supply device for supplying a source gas to generate desired ion species, an electrode for exciting a source gas to generate plasma, and the like. As the electrode for generating plasma, a filament electrode, a capacitively coupled high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions which are generated from the ion source are accelerated. Note that components of the ion doping apparatus are not limited to the above-described components and an as-needed mechanism may be provided.

In this embodiment, hydrogen is added to the semiconductor substrate 100 with an ion doping apparatus. A hydrogen-containing gas is supplied as a plasma source gas. For example, $H_2$ is supplied. A hydrogen gas is excited to generate plasma; ions included in plasma are accelerated without mass separation; and the semiconductor substrate 100 is irradiated with the accelerated ions.

In an ion doping apparatus, the percentage of $H_3^+$ to the total amount of ion species ($H^+$, $H_2^+$, and $H_3^+$) that are generated from a hydrogen gas is set to 50% or more. Preferably, the percentage of $H_3^+$ is set to 80% or more. Because an ion doping apparatus does not involve mass separation, the percentage of one ($H_3^+$) of plural kinds of ion species that are generated in plasma is preferably 50% or more, more preferably, 80% or more. By irradiation with ions having the same mass, ions can be added in a concentrated manner to the same depth in the semiconductor substrate 100. Here, the term "main component" means the ions having the same mass, the percentage of which included in the plural kinds of ion species is 50% or more. In the above, the semiconductor substrate 100 is irradiated with the plurality of ions included $H_3^+$ as the main component.

In order to form the embrittled region 104 in a shallow region, the acceleration voltage for the ions 103 needs to be low. With an increase in the percentage of $H_3^+$ ions in plasma, atomic hydrogen (H) can be efficiently added to the semiconductor substrate 100. Because the mass of an $H_3^+$ ion is three times as large as that of an $H^+$ ion, when one hydrogen atom is added to the same depth, the acceleration voltage for an $H_3^+$ ion can be three times as high as that of an $H^+$ ion. When the acceleration voltage for ions can be increased, the takt time for ion irradiation treatment can be shortened and productivity and throughput can be improved.

Because ion doping apparatuses are inexpensive and excellent for use in large-area treatment, by irradiation with $H_3^+$ by use of such an ion doping apparatus, significant effects such as an improvement in semiconductor characteristics, an increase in area, a reduction in costs, and an improvement in production efficiency can be obtained. Further, in the case where an ion doping apparatus is used, heavy metals may also be introduced at the time of the ion irradiation; however, by irradiation with ions through the oxide film 102 containing chlorine atoms, the semiconductor substrate 100 can be prevented from being contaminated due to these heavy metals as described above.

Note that the step of irradiating the semiconductor substrate 100 with the accelerated ions 103 can also be performed with an ion implantation apparatus. An ion implantation apparatus is a mass-separation apparatus with which an object placed in a chamber is irradiated with an ion species having a specific mass after mass separation of plural kinds of ion species generated by excitation of a source gas into plasma. Thus, in the case of using an ion implantation apparatus, $H^+$ ions and $H_2^+$ ions that are generated by excitation of a hydrogen gas and $PH_3$ are subjected to mass separation, and either $H^+$ ions or $H_2^+$ ions are accelerated, with which the semiconductor substrate 100 is irradiated.

Figures 1, 1A, 2, 3:
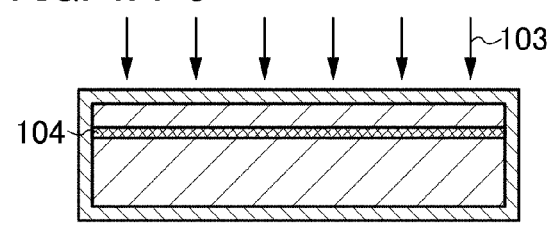
Figures 1, 1A, 2, 3, 4:
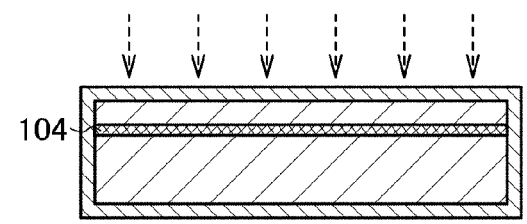
Figures 1, 1B:
Figures 1, 1B, 2:
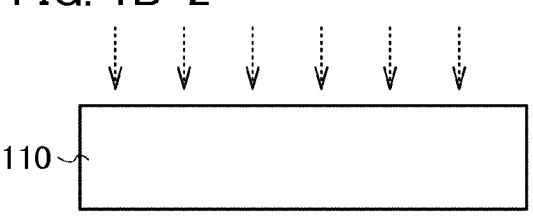

Next, a base substrate 110 is prepared (see FIG. 1B-1).

As the base substrate 110, a substrate made from an insulator is used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. In this embodiment, a case is described in which a glass substrate is used. When a glass substrate which can be manufactured in a large size and is inexpensive is used as the base substrate 110, cost reduction can be achieved as compared to when a silicon wafer is used.

Before the base substrate 110 is used, it is preferable that a surface of the base substrate 110 be cleaned in advance. Specifically, the base substrate 110 is subjected to ultrasonic cleaning using a hydrochloric acid/hydrogen peroxide mixture (HPM), a sulfuric acid/hydrogen peroxide mixture (SPM), an ammonium hydroxide/hydrogen peroxide mixture (APM), dilute hydrofluoric acid (DHF), ozone water, or the like. For example, it is preferable that a surface of the base substrate 110 be subjected to ultrasonic cleaning using an HPM. By such cleaning treatment, the surface of the base substrate 110 can be planarized and residual abrasive particles can be removed.

Next, the surface of the base substrate 110 is subjected to plasma treatment (see FIG. 1B-2).

Here, plasma treatment is performed in a plasma state by introducing an inert gas (for example, an Ar gas) into a chamber in a vacuum state and applying a bias voltage to a surface to be processed (here, the base substrate). Electrons and Ar cations are present in plasma and the Ar cations are accelerated in a cathode direction (to the base substrate 110 side). The accelerated Ar cations collide with a surface of the base substrate 110, whereby the surface of the base substrate 110 is etched by sputtering. At this time, a projection of the surface of the base substrate 110 is preferentially etched by sputtering; thus, planarity of the surface of the base substrate 110 can be improved. Further, by the accelerated Ar cations, impurities such as organic substances over the base substrate can be removed and the base substrate can be activated. Furthermore, plasma treatment may be performed in a plasma state by introducing a reactive gas (for example, an $O_2$ gas or an $N_2$ gas) as well as an inert gas into a chamber in a vacuum state and applying a bias voltage to a surface to be processed. In the case where a reactive gas is introduced, defects caused by etching of the surface of the base substrate 110 by sputtering can be repaired.

Figure 12:
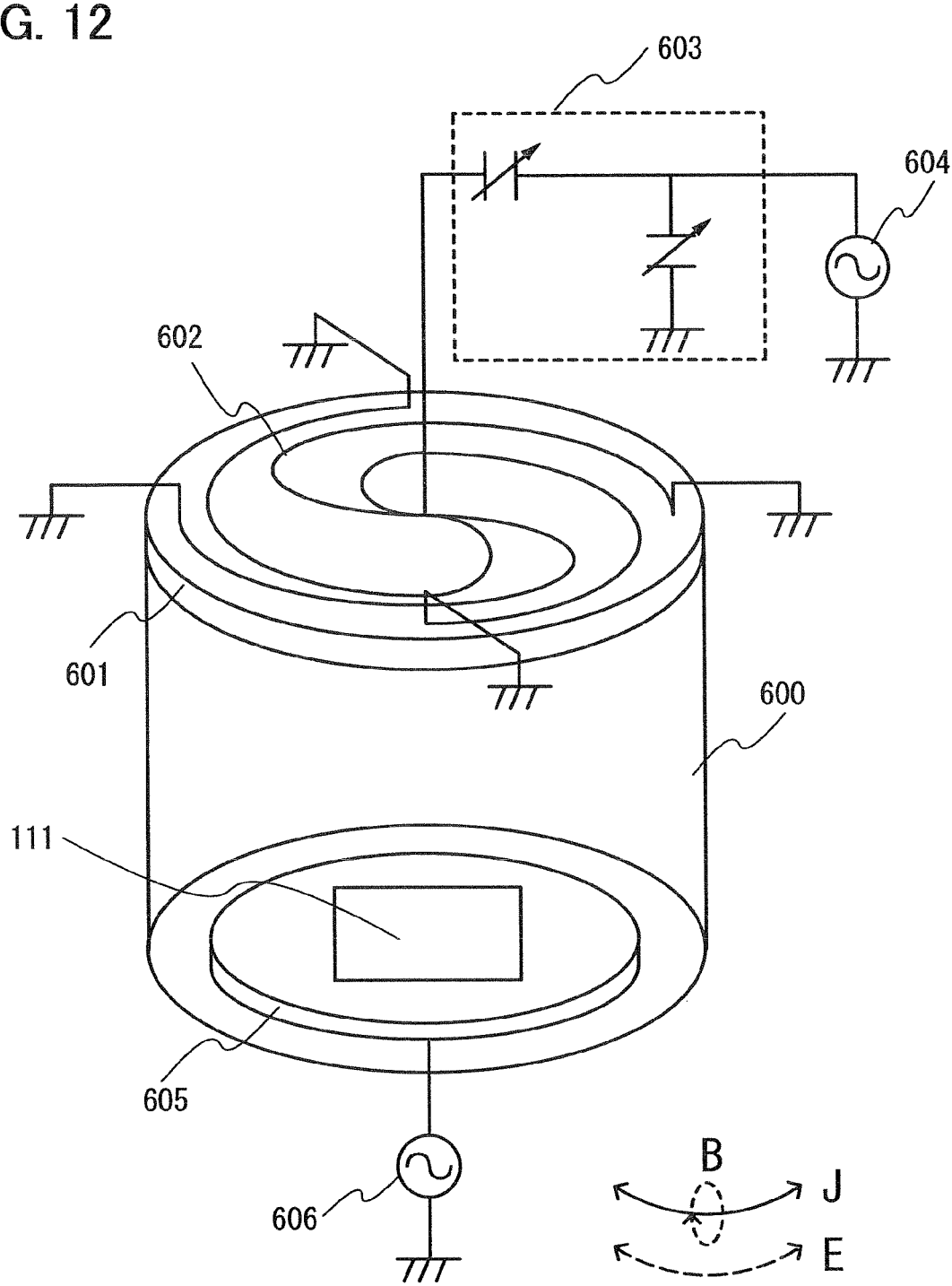
FIG. 12 is a diagram illustrating an example of plasma treatment in a method for manufacturing an SOI substrate according to one embodiment of the present invention.

In this embodiment, plasma treatment of an inductively coupled plasma (ICP) method is performed using an argon gas. FIG. 12 is a simplified structural diagram of a plasma treatment apparatus. A multi-spiral coil 602 is provided over a quartz plate 601 in an upper portion of a chamber 600, and is connected to an RF power source 604 with a matching box 603 interposed therebetween. Further, a lower electrode 605 on the base substrate 110 side which faces the multi-spiral coil 602 is connected to an RF power source 606. When an RF current is applied to the multi-spiral coil 602 over the base substrate 110, an RF current J flows through the multi-spiral coil 602 in a direction θ, so that a magnetic field B is produced in a direction Z. Note that in the formula, $\mu_0$ represents the magnetic susceptibility.

$$\mu_0 J = rot B$$

An induction field E is produced in the direction θ by the Faraday's law of electromagnetic induction.

$$-\frac{\partial B}{\partial t} = rot E$$

Electrons are accelerated in the direction θ with this induction field E, and collide with molecules of the gas, whereby plasma is produced. A plasma region in which plasma with a high density spreads in a sheet-like form between electrodes can be obtained because the magnetic field B is hardly produced on the substrate side. Cations are accelerated with a bias voltage applied to the base substrate 110 side, and collide with the base substrate 110.

Note that argon plasma treatment may be specifically performed under conditions with an ICP power of 100 W to 3000 W, a pressure of 0.1 Pa to 5.0 Pa, a gas flow rate of 5 sccm to 2000 sccm, and an RF bias voltage of 75 W to 300 W. More specifically, argon plasma treatment may be performed under conditions with an ICP power of 500 W (0.11 W/cm$^2$), a pressure of 1.35 Pa, a gas flow rate of 100 sccm, and an RF bias voltage of 100 W (0.61 W/cm$^2$).

By performing planarization treatment with plasma treatment, the average surface roughness ($R_a$) and the maximum peak-to-valley height (P-V) on the surface of the base substrate 110 can be reduced.

Note that in this embodiment, a method is described in which the base substrate side is subjected to plasma treatment; however, one embodiment of the present invention is not limited thereto and at least one of the semiconductor substrate 100 and the base substrate 110 may be subjected to plasma treatment (see FIGS. 1A-4 and 1B-2).

Figure 1C:
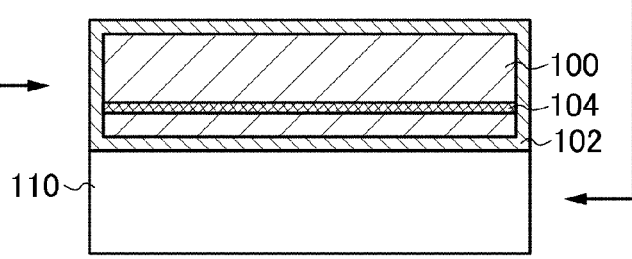

Next, the surface of the semiconductor substrate 100 and the surface of the base substrate 110 are disposed opposite to each other, and the surface of the oxide film 102 and the surface of the base substrate 110 are bonded to each other (see FIG. 1C).

Here, after the semiconductor substrate 100 and the base substrate 110 are disposed in contact with each other, a pressure of about 0.1 N/cm$^2$ to 50 N/cm$^2$, preferably, 0.1 N/cm$^2$ to 20 N/cm$^2$ is applied to a portion of the semiconductor substrate 100. From the portion where pressure is applied, the oxide film 102 and the base substrate 110 start bonding to each other and bonding extends to almost the entire area. This bonding step is performed by the action of van der Waals force or hydrogen bonding and can be performed at room temperature without any heat treatment. Thus, a substrate having a low heat resistance, such as a glass substrate, can be used as the base substrate 110.

Note that, before the semiconductor substrate 100 and the base substrate 110 are bonded to each other, at least one of the oxide film 102 formed on the semiconductor substrate 100 and the base substrate 110 is preferably subjected to surface treatment. As surface treatment, ozone treatment (such as cleaning with ozone water), megasonic cleaning, or both in combination can be performed. Alternatively, the oxide film 102 formed on the semiconductor substrate 100 may be repeatedly subjected to cleaning with ozone water and cleaning with hydrofluoric acid plural times. By such surface treatment, dust such as organic substances on the surface of the oxide film 102 and the surface of the base substrate 110 can be removed and the surfaces can be made hydrophilic.

Here, an example of ozone treatment is described. For example, a surface of an object to be processed can be subjected to ozone treatment by irradiation with ultraviolet (UV) in an atmosphere containing oxygen. Ozone treatment in which irradiation with ultraviolet is performed under an atmosphere containing oxygen is also called UV ozone treatment, ultraviolet ozone treatment, or the like. In an atmosphere containing oxygen, irradiation with light including a wavelength of less than 200 nm and light including a wavelength of 200 nm or more among ultraviolet is performed, whereby ozone can be generated and singlet oxygen can be generated from ozone. Irradiation with light including a wavelength of less than 180 nm among ultraviolet is performed, whereby ozone can be generated and singlet oxygen can also be generated from ozone.

Examples of reactions which occur by performing irradiation with light including a wavelength of less than 200 nm and light including a wavelength of 200 nm or more in an atmosphere containing oxygen are described.

  (1)

  (2)

  (3)

In the above reaction formula (1), irradiation with light (hν) including a wavelength ($\lambda_1$ nm) of less than 200 nm in an atmosphere containing oxygen ($O_2$) is performed to generate oxygen atoms ($O(^3P)$) in a ground state. Next, in the reaction formula (2), the oxygen atoms ($O(^3P)$) in a ground state and oxygen ($O_2$) are reacted with each other to generate ozone ($O_3$). Then, in the reaction formula (3), irradiation with light including a wavelength ($\lambda_2$ nm) of 200 nm or more in an atmosphere containing the generated ozone ($O_3$) is performed to generate singlet oxygen $O(^1D)$ in an excited state. In an atmosphere containing oxygen, irradiation with light including a wavelength of less than 200 nm among ultraviolet is performed to generate ozone while irradiation with light including a wavelength of 200 nm or more among ultraviolet is performed to generate singlet oxygen by decomposing the ozone. The above-described ozone treatment can be performed by irradiation with light from a low-pressure mercury lamp ($\lambda_1=185$ nm, $\lambda_2=254$ nm) in an atmosphere containing oxygen, for example.

In addition, examples of reactions which occur by performing irradiation with light including a wavelength of less than 180 nm in an atmosphere containing oxygen are described.

  (4)

  (5)

  (6)

In the above reaction formula (4), irradiation with light including a wavelength ($\lambda_3$ nm) of less than 180 nm in an atmosphere containing oxygen ($O_2$) is performed to generate singlet oxygen $O(^1D)$ in an excited state and oxygen atoms ($O(^3P)$) in a ground state. Next, in the reaction formula (5), oxygen atoms ($O(^3P)$) in a ground state and oxygen ($O_2$) are reacted with each other to generate ozone ($O_3$). In the reaction formula (6), irradiation with light including a wavelength ($\lambda_3$ nm) of less than 180 nm in an atmosphere containing the generated ozone ($O_3$) is performed to generate singlet oxygen in an excited state and oxygen. In an atmosphere containing oxygen, irradiation with light including a wavelength of less than 180 nm among ultraviolet is performed to generate ozone while the ozone or oxygen is decomposed to generate singlet oxygen. The above-described ozone treatment can be performed by irradiation with light from a Xe excimer UV lamp ($\lambda_{3=172}$ nm) in an atmosphere containing oxygen, for example.

Chemical bonding of an organic substance or the like attached to a surface of an object to be processed is cut by light including a wavelength of less than 200 nm, whereby the organic substance attached to the surface of the object to be processed or the organic substance whose chemical bonding is cut and the like can be removed by oxidative decomposition with ozone or singlet oxygen generated from ozone. By performing the above-described ozone treatment, hydrophilicity and purity of the surface of the object to be processed can be increased, and bonding can be favorably performed.

In an atmosphere containing oxygen, ozone is generated by performing irradiation with ultraviolet. Ozone is effective in removing the organic substance attached to the surface of the object to be processed. In addition, singlet oxygen is also effective in removing the organic substance attached to the surface of the object to be processed as much as or more than ozone. Ozone and singlet oxygen are examples of oxygen in an active state and also collectively called active oxygen. As described with the above reaction formulae and the like, because there are reactions where ozone is generated in generating singlet oxygen or singlet oxygen is generated from ozone, here, such reactions including a reaction where singlet oxygen contributes are called ozone treatment for convenience.

Before the semiconductor substrate 100 and the base substrate 110 are bonded to each other, at least one of the oxide film 102 formed on the semiconductor substrate 100 and the base substrate 110 is subjected to one of plasma treatment and surface treatment, or both in combination. Accordingly, defective bonding can be suppressed.

In addition, after the semiconductor substrate 100 is bonded to the base substrate 110, heat treatment is preferably performed in order to increase bonding strength between the oxide film 102 and the base substrate 110. This heat treatment is performed at a temperature where a crack is not generated in the embrittled region 104, for example, at a temperature in the range of greater than or equal to a room temperature and less than 400° C. The oxide film 102 may be bonded to the base substrate 110 while heating at a temperature within the above range. The heat treatment can be performed using a diffusion furnace, a heating furnace such as a resistance heating furnace, a rapid thermal annealing (RTA) apparatus, a microwave heating apparatus, or the like.

In general, when heat treatment is performed at the same time as or after bonding of the oxide film 102 and the base substrate 110, the dehydration reaction at the bonding interface proceeds and the bonding surfaces come close to each other; thus, bond is strengthened by strengthening of hydrogen bonding and formation of covalent bonding. In order to promote the dehydration reaction, moisture generated at the bonding interface through the dehydration reaction should be removed by heat treatment at high temperature. That is, when heat treatment after bonding is performed at low temperature, moisture generated at the bonding interface through the dehydration reaction cannot be removed effectively; thus, the dehydration reaction does not progress and there is a difficulty in improving bonding strength sufficiently.

On the other hand, in the case where an oxide film containing chlorine atoms or the like is used as the oxide film 102, the oxide film 102 can absorb and diffuse moisture. Thus, even when heat treatment after bonding is performed at low temperature, moisture generated at the bonding interface through the dehydration reaction can be absorbed and diffused into the oxide film 102, and the dehydration reaction can be promoted efficiently.

In this case, even when a low heat-resistant substrate such as a glass substrate is used as the base substrate 110, the bonding strength between the oxide film 102 and the base substrate 110 can be sufficiently improved. Further, by performing plasma treatment by applying a bias voltage, moisture at the bonding interface can be effectively absorbed and diffused into the oxide film 102. Accordingly, the bonding strength between the oxide film 102 and the base substrate 110 can be improved even when heat treatment is performed at low temperature.

Figure 1D:
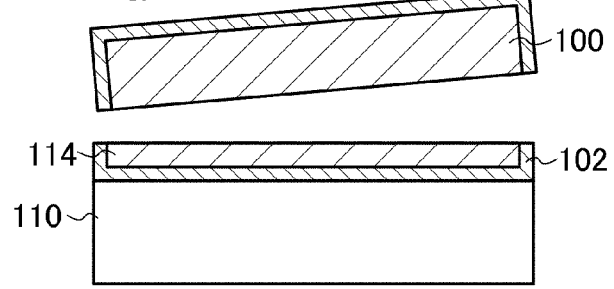

Next, heat treatment is performed to cause separation (cleavage) along the embrittled region 104, whereby a semiconductor layer 114 (here, a single crystal semiconductor layer) is provided over the base substrate 110 with the oxide film 102 interposed therebetween (see FIG. 1D).

By heat treatment, due to temperature increase, the pressure in microvoids formed in the embrittled region 104 is increased. Due to pressure increase, the volume of the microvoids formed in the embrittled region 104 is changed and a crack is generated in the embrittled region 104, whereby the semiconductor substrate 100 is separated along the embrittled region 104. Because the oxide film 102 is bonded to the base substrate 110, the semiconductor layer 114 that is separated from the semiconductor substrate 100 is formed over the base substrate 110. This heat treatment is performed at a temperature not exceeding the strain point of the base substrate 110.

This heat treatment can be performed using a diffusion furnace, a heating furnace such as a resistance heating furnace, a rapid thermal annealing (RTA) apparatus, a microwave heating apparatus, or the like. For example, in a case of using an RTA apparatus, the heat treatment can be performed at a heating temperature of greater than or equal to 550° C. and less than or equal to 730° C. for greater than or equal to 0.5 min. and less than or equal to 60 min.

Note that, by the heat treatment of FIG. 1D without the above-described heat treatment for increasing the bonding strength between the base substrate 110 and the oxide film 102, the heat treatment step for increasing the bonding strength between the base substrate 110 and the oxide film 102 and the heat treatment step for causing separation along the embrittled region 104 may be performed at the same time.

Through the above steps, an SOI substrate in which the semiconductor layer 114 is provided over the base substrate 110 with the oxide film 102 interposed therebetween can be manufactured.

In addition, by forming the oxide film containing halogen such as chlorine on the semiconductor substrate side, a manufacturing process can be simplified and impurity elements can be prevented from entering the semiconductor substrate before the semiconductor substrate is bonded to the base substrate. Further, by forming the oxide film containing halogen such as chlorine as a bonding layer which is provided on the semiconductor substrate side, bonding strength can be improved by promoting the dehydrogenation reaction efficiently even when heat treatment after bonding is performed at low temperature.

Note that in this embodiment, a surface of the SOI substrate may be subjected to planarization treatment after separation. By planarization treatment, the surface of the SOI substrate can be planarized even when unevenness is caused on the surface of the semiconductor layer 114 provided over the base substrate 110 after separation. The planarization treatment can be performed by chemical mechanical polishing (CMP), etching treatment, laser light irradiation, or the like. Here, the semiconductor layer 114 is recrystallized and its surface is planarized by being irradiated with laser light after etching treatment (etch-back treatment) is performed by either dry etching or wet etching or by both in combination.

By irradiation with laser light from an upper surface side of the single crystal semiconductor layer, the upper surface of the single crystal semiconductor layer can be melted. After being melted, the single crystal semiconductor layer is cooled and solidified, whereby a single crystal semiconductor layer having an upper surface with higher planarity can be obtained. With the use of laser light, the base substrate 110 is not directly heated; thus, increase in the temperature of the base substrate 110 can be suppressed. Accordingly, a substrate having a low heat resistance, such as a glass substrate, can be used as the base substrate 110.

Note that it is preferable that the semiconductor layer 114 be partially melted by laser light irradiation. This is because, if the semiconductor layer 114 is completely melted, it is microcrystallized due to random nucleation after being changed into a liquid phase, so that crystallinity of the semiconductor layer 114 is highly likely to decrease. On the other hand, by partial melting, crystal growth proceeds from a non-melted solid phase part. Accordingly, defects in the semiconductor layer can be reduced. Note that the term "complete melting" used herein means that the single crystal semiconductor layer is melted into a liquid state down to the vicinity of its lower interface. On the other hand, the term "partial melting" means that the upper portion of the single crystal semiconductor layer is melted into a liquid phase, but the lower portion is not melted and remains in a solid phase.

For the above-described laser light irradiation, a pulsed laser is preferably used. This is because a pulsed laser can instantaneously emit a pulsed laser beam with high energy, with which a partially melted state can easily be created. The repetition rate is preferably about greater than or equal to 1 Hz and less than or equal to 10 MHz.

After the above-described laser light irradiation, a thinning step may be performed to reduce the thickness of the semiconductor layer 114. The semiconductor layer 114 may be thinned by etching treatment (etch-back treatment) by either dry etching or wet etching or by both in combination. For example, when the semiconductor layer 114 is formed from a silicon material, the semiconductor layer 114 can be thinned by dry etching using $SF_6$ and $O_2$ as a process gas. Note that in this embodiment, a case is described in which etch-back treatment is performed after irradiation with laser light; however, one embodiment of the present invention is not limited thereto, and etch-back treatment may be performed before irradiation with laser light, or both before and after irradiation with laser light.

Through the above steps, the SOI substrate can be manufactured. The base substrate is subjected to plasma treatment, whereby unevenness and particles on the surface of the base substrate can be suppressed. Further, planarity of the base substrate is improved; thus, hydrophilicity of the base substrate can be improved. As a result, in a step for bonding the semiconductor substrate to the base substrate, hydrogen bonding is highly likely to occur at a bonding interface and bonding strength between the base substrate and the semiconductor substrate can be improved. Thus, the SOI substrate can be manufactured in which adhesiveness between the semiconductor layer and the base substrate is improved; defective bonding is suppressed; and sufficient bonding strength is provided in a bonding step and also in a process for manufacturing a semiconductor device.

Note that not only an SOI substrate but also the semiconductor substrate 100 after separation may be subjected to planarization treatment. By planarization of the surface of the semiconductor substrate 100 after separation, the semiconductor substrate 100 can be reused in a process for manufacturing an SOI substrate.

Note that the method for manufacturing an SOI substrate described in this embodiment can be appropriately combined with manufacturing methods in other embodiments of this specification.

Embodiment 2

In this embodiment, a method for manufacturing an SOI substrate, which is different from that in the above-described embodiment, is described with reference to drawings. Specifically, a case is described in which a base substrate is subjected to plasma treatment before a nitrogen-containing layer is formed over the base substrate.

First, the semiconductor substrate 100 whose surface is provided with the oxide film 102 and in which the embrittled region 104 is provided at a predetermined depth is prepared (see FIGS. 2A-1 to 2A-3). Note that steps illustrated in FIGS. 2A-1 to 2A-3 can be performed in a similar manner to those illustrated in FIGS. 1A-1 to 1A-3.

Figures 1, 2A:
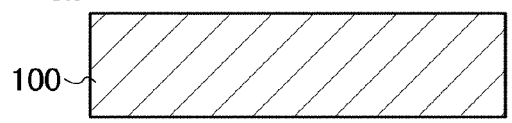
Figures 2, 2A:
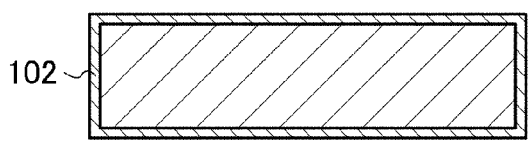
Figures 2, 2A, 3:
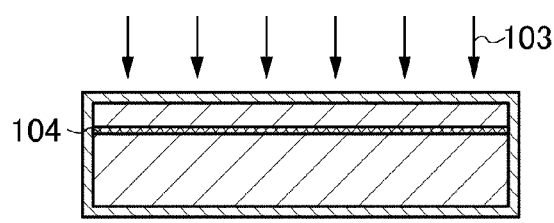
Figures 2, 2A, 3, 4:
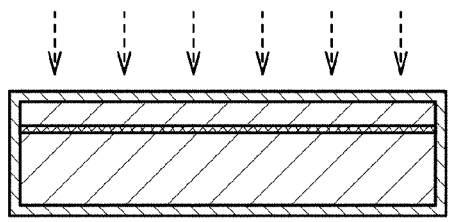
Figures 1, 2B:
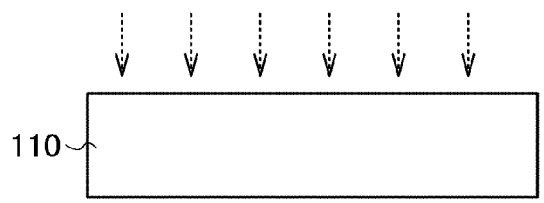
Figures 2, 2B:
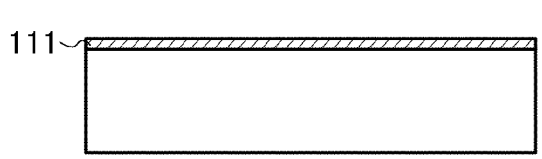
Figures 2, 2B, 3:
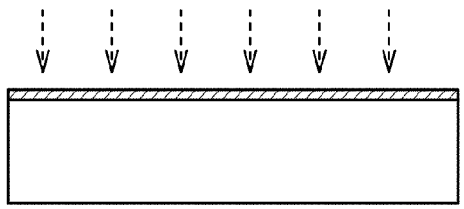

Next, after the base substrate 110 is prepared, the base substrate 110 is subjected to planarization treatment by plasma treatment (see FIG. 2B-1).

As described in Embodiment 1, plasma treatment is performed in a plasma state by introducing an inert gas (such as an argon (Ar) gas) into a chamber in a vacuum state and applying a bias voltage to a surface to be processed. Further, plasma treatment can also be performed in a plasma state by introducing a reactive gas (for example, an $O_2$ gas or an $N_2$ gas) as well as an inert gas into a chamber in a vacuum state and applying a bias voltage to a surface to be processed.

Specific conditions may be as follows: an ICP power is 100 W to 3000 W, a pressure is 0.1 Pa to 5.0 Pa, a gas flow rate is 5 sccm to 2000 sccm, and an RF bias voltage is 75 W to 300 W. More specific conditions may be as follows: an ICP power is 500 W (0.11 W/cm$^2$), a pressure is 1.35 Pa, a gas flow rate is 100 sccm, and an RF bias voltage is 100 W (0.61 W/cm$^2$).

By performing planarization treatment with plasma treatment, the average surface roughness ($R_a$) and the maximum peak-to-valley height (P-V) on the surface of the base substrate 110 can be reduced.

Further, when the above-described plasma treatment is performed, by performing precoating treatment on an inner wall of the chamber, a metal constituting the reaction chamber (iron (Fe), nickel (Ni), chromium (Cr), or the like) can be prevented from being attached to the surface of the base substrate 110 as impurities. For example, by covering an inner wall of the reaction chamber with an insulating film such as a silicon oxide film, a silicon film, an aluminum oxide film, or a silicon carbide (SiC) film as the precoating treatment, contamination of the surface of the base substrate 110, which accompanies the planarization treatment, can be suppressed.

As described above, by performing planarization treatment, planarity of the surface of the base substrate 110 can be improved. Even in the case where a substrate polished by CMP or the like is used as the base substrate 110, abrasive particles ($CeO_2$ or the like) which remain over the base substrate 110 can be removed and the surface of the base substrate 110 can be planarized. As a result, planarity of a film formed over the base substrate 110 can be improved.

Note that the base substrate 110 may be cleaned before the base substrate 110 is subjected to planarization treatment. Specifically, the base substrate 110 is subjected to ultrasonic cleaning using a hydrochloric acid/hydrogen peroxide mixture (HPM), a sulfuric acid/hydrogen peroxide mixture (SPM), an ammonium hydroxide/hydrogen peroxide mixture (APM), dilute hydrofluoric acid (DHF), ozone water, or the like. For example, it is preferable that the surface of the base substrate 110 be subjected to ultrasonic cleaning using an HPM. By such cleaning treatment, the surface of the base substrate 110 can be planarized and residual abrasive particles can be removed to some extent.

Next, a nitrogen-containing layer 111 is formed over the surface of the base substrate 110 (see FIG. 2B-2).

The nitrogen-containing layer 111 (for example, an insulating film including nitrogen such as a silicon nitride film ($SiN_x$) or a silicon nitride oxide film ($SiN_xO_y$) (x>y)) is formed over the base substrate 110 planarized by plasma treatment (see FIG. 2B-2).

In order to form such a nitrogen-containing layer 111, it is preferable that a silicon nitride film or a silicon nitride oxide film be formed by a plasma CVD method at a substrate temperature during film formation greater than or equal to a room temperature and less than or equal to 350° C., more preferably, greater than or equal to a room temperature and less than or equal to 300° C. in this embodiment. When the substrate temperature during film formation is low, the nitrogen-containing layer 111 can be formed to have less surface roughness. This is because as the substrate temperature during film formation becomes higher, the etching reaction on a deposition surface of a film due to hydrogen radicals or the like becomes excessive and surface roughness is generated.

When the nitrogen-containing layer 111 is formed after the surface of the base substrate 110 is planarized by plasma treatment, a surface of the nitrogen-containing layer can be smoothed. By smoothing the surface of the nitrogen-containing layer, defective bonding can be suppressed even when the nitrogen-containing layer is used as a bonding layer. Specifically, the nitrogen-containing layer 111 is formed to have a surface with an average surface roughness ($R_a$) of 0.5 nm or less and a root-mean-square surface roughness ($R_{ms}$) of 0.60 nm or less, preferably, an average surface roughness of 0.45 nm or less. The thickness is preferably in the range of greater than or equal to 10 nm and less than or equal to 200 nm, more preferably, greater than or equal to 50 nm and less than or equal to 100 nm.

In addition, because hydrogen bonding greatly contributes to bonding with the oxide film 102 formed on the semiconductor substrate 100, the nitrogen-containing layer 111 is preferably formed to contain hydrogen. By use of a silicon nitride film or a silicon nitride oxide film containing hydrogen as the nitrogen-containing layer 111, it is possible to form strong bond with a base substrate such as a glass substrate by hydrogen bonding using Si—OH and N—OH bonds.

In this embodiment, the nitrogen-containing layer 111 functions as a layer bonded to the oxide film 102 provided on the semiconductor substrate 100 (a bonding layer). When a single crystal semiconductor layer is provided over the base substrate later, the nitrogen-containing layer 111 also functions as a barrier layer for preventing an impurity such as Na (sodium) contained in the base substrate from diffusing into the single crystal semiconductor layer.

In this embodiment, it is preferable that film formation be performed by a plasma CVD method using at least a silane gas, an ammonia gas, and a hydrogen gas. By use of an ammonia gas and a hydrogen gas, the nitrogen-containing layer 111 that contains hydrogen in itself can be obtained. Furthermore, when the substrate temperature during film formation is low, there are also advantages in that the dehydrogenation reaction during film formation can be suppressed and the amount of hydrogen contained in the nitrogen-containing layer 111 can be increased.

The nitrogen-containing layer 111 that is obtained by a plasma CVD method at a low substrate temperature during film formation contains a large amount of hydrogen and has low density (or is soft). The nitrogen-containing layer 111 having low density can be densified (hardened) by heat treatment; thus, the thickness of the nitrogen-containing layer 111 can be decreased through the heat treatment.

Therefore, by bonding of the nitrogen-containing layer 111 having low density and the semiconductor substrate 100, even when the surface of the oxide film provided on the semiconductor substrate 100 or the surface of the nitrogen-containing layer 111 is uneven, the unevenness can be absorbed by shrink of the nitrogen-containing layer 111. Thus, defective bonding can be suppressed. Moreover, by heat treatment performed at the same time as or after bonding, an element such as a transistor can be formed after the nitrogen-containing layer 111 is densified (hardened).

Next, it is preferable that at least one of the surfaces of the oxide film 102 formed on the semiconductor substrate 100 and the nitrogen-containing layer 111 formed over the base substrate 110 be subjected to plasma treatment. Both of the surfaces of the oxide film 102 formed on the semiconductor substrate 100 and the nitrogen-containing layer 111 formed over the base substrate 110 be subjected to plasma treatment (see FIGS. 2A-4 and 2B-3). In this manner, both of the oxide film 102 and the nitrogen-containing layer 111 are subjected to plasma treatment, whereby hydrophilic groups can be increased and the surface can be activated by generation of dangling bonds.

For example, in the case where plasma treatment is performed, the plasma treatment is performed in a plasma state by introducing an oxygen gas into a chamber in a vacuum state and applying a bias voltage to an object to be processed. Oxygen cations are present in plasma and accelerated in a cathode direction (to the semiconductor substrate 100 side). The accelerated oxygen cations collide with the surface to be processed, whereby impurities such as organic substances over the surface to be processed can be removed and the surface to be processed can be activated.

For example, in the case where the oxide film 102 on the semiconductor substrate 100 is subjected to plasma treatment, the accelerated oxygen cations collide with the surface of the oxide film 102, whereby Si—H, $SiH_2$, and $SiO_2$ on the surface of the oxide film 102 can be decreased and $(SiO_2)_n$—OH can be increased. That is, by increasing hydrophilic groups on the surface of the oxide film 102, the number of hydrogen bonds on a bonding surface can be increased; therefore, bonding strength can be improved. In addition, by performing plasma treatment by applying a bias voltage, a micropore can be generated in the vicinity of the surface of the oxide film 102.

Further, in the case where the nitrogen-containing layer 111 over the base substrate 110 is subjected to plasma treatment, SiN and $SiH_3$ each having a hydrophobic property on the surface of the nitrogen-containing layer 111 can be decreased, and $SiO_x$ having a hydrophilic property can be increased; therefore, bonding strength can be improved even when the nitrogen-containing layer 111 is used as a bonding layer.

Figure 13:
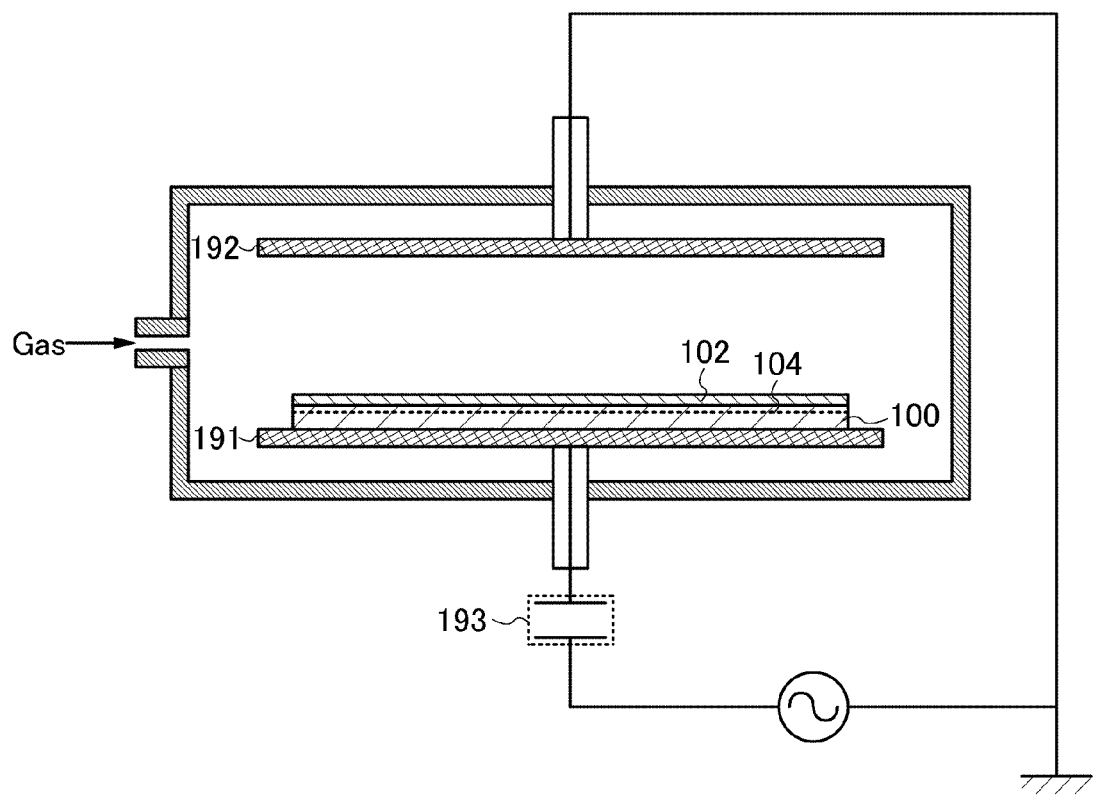
FIG. 13 is a diagram illustrating an example of plasma treatment in a method for manufacturing an SOI substrate according to one embodiment of the present invention.

In this embodiment, plasma treatment is performed using an oxygen gas by a method called a reactive ion etching (RIE) mode, which is a kind of capacitively coupled plasma (see FIG. 13). The semiconductor substrate 100 that is provided with the oxide film 102 is placed on a stage over a first electrode 191 which serves as a cathode to which a high-frequency voltage is applied through a capacitor 193, and a high-frequency voltage is applied to generate plasma between the first electrode 191 and a second electrode 192 which serves as an anode. As a result, a negative self-bias is generated (a state in which a bias is applied is created) in the first electrode 191, and cations in plasma are accelerated to collide with the semiconductor substrate 100. Note that oxygen is used as a source gas because the oxide film 102 formed on the semiconductor substrate 100 is silicon oxide. Thus, etching action of the oxide film 102 can be made weak. Note that the plasma density for the RIE mode is lower than that for ICP.

Oxygen plasma treatment may be specifically performed under conditions with a treatment power of 0.3 W/cm$^2$ to 1.5 W/cm$^2$, a pressure of 30 Pa to 130 Pa, a gas ($O_2$) flow rate of 10 sccm to 200 sccm. Further, by oxygen plasma treatment, the average surface roughness ($R_a$) on the surface of the oxide film 102 is preferably made 0.7 nm or less, more preferably, 0.3 nm or less.

Figure 14:
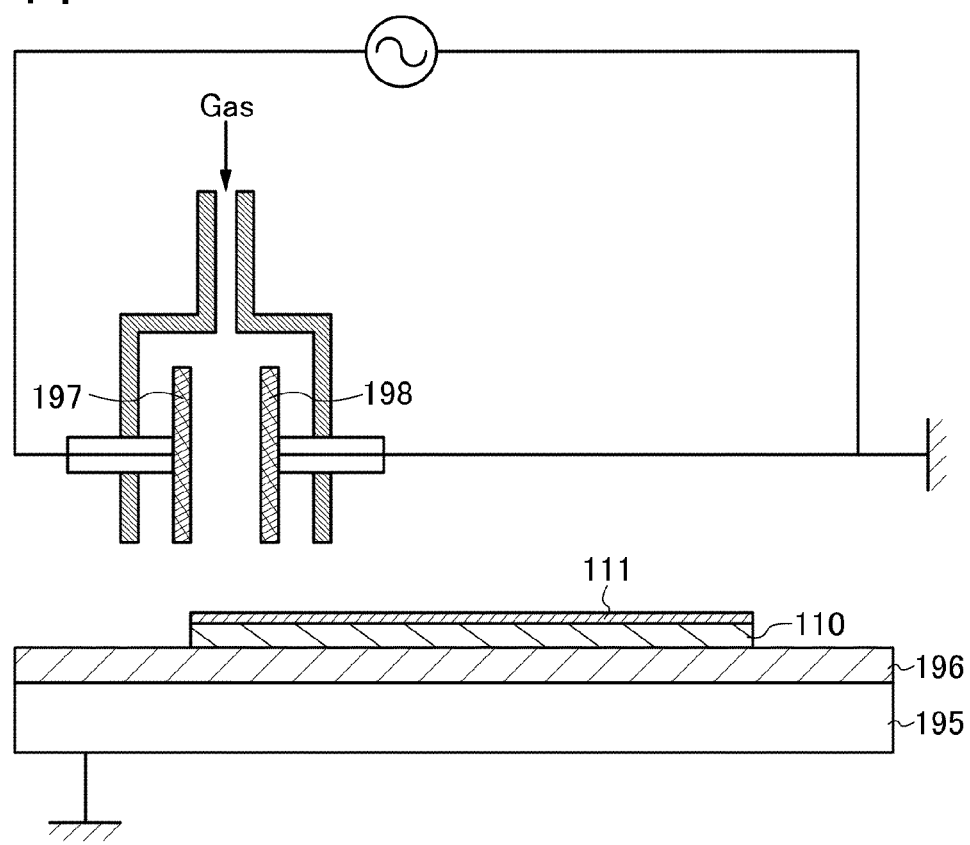
FIG. 14 is a diagram illustrating an example of plasma treatment in a method for manufacturing an SOI substrate according to one embodiment of the present invention.

Note that a method for performing plasma treatment which is employed in this embodiment is not limited to the case described with reference to FIG. 13. Alternatively, plasma treatment can be performed using atmospheric pressure plasma such as dielectric-barrier discharge (see FIG. 14). For example, in the case where the surface of the nitrogen-containing layer 111 formed over the base substrate 110 is subjected to plasma treatment, the base substrate 110 over which the nitrogen-containing layer 111 is formed is placed over a support 196 (for example, a glass substrate) provided over a stage 195 made from a conductor, and a gas is introduced between a first electrode 197 and a second electrode 198 to generate atmospheric pressure plasma. As a result, a self-bias is generated between the base substrate 110 placed over the support 196 and a gas which is introduced between the first electrode 197 and the second electrode 198 and is made into plasma (a state in which a bias is applied is created), and cations in plasma are accelerated to collide with the surface of the nitrogen-containing layer 111 formed over the base substrate 110. Note that atmospheric pressure plasma treatment may be specifically performed under conditions with a treatment power of 100 W to 500 W and a gas ($O_2$, $N_2$, $O_2+N_2$, Ar, or He) flow rate of 10 sccm to 200 sccm. Note that in the case where an object to be processed (here, the nitrogen-containing layer 111) is larger than a distance between the first electrode 197 and the second electrode 198, the object to be processed may be scanned by moving the first electrode 197 and the second electrode 198.

Next, it is preferable that the oxide film 102 formed on the semiconductor substrate 100 and the nitrogen-containing layer 111 formed over the base substrate 110 be subjected to surface treatment before the semiconductor substrate 100 and the base substrate 110 are bonded to each other. The surface treatment method is described in Embodiment 1; thus, specific description thereof is omitted.

Figure 2C:
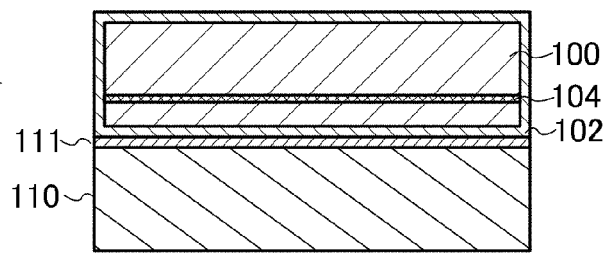
Figure 2D:
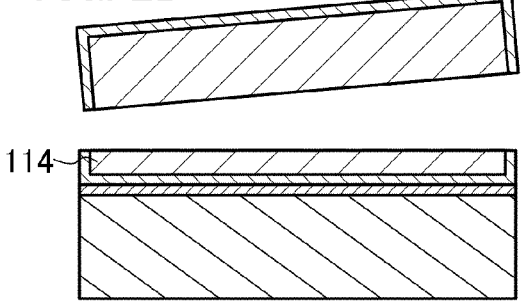

After that, the surface of the semiconductor substrate 100 and the surface of the base substrate 110 are disposed opposite to each other and the surface of the oxide film 102 and the surface of the nitrogen-containing layer 111 are bonded to each other (see FIG. 2C). Subsequently, by separation (cleavage) along the embrittled region 104 by heat treatment, the semiconductor layer 114 is provided over the base substrate 110 with the nitrogen-containing layer 111 and the oxide film 102 interposed therebetween (see FIG. 2D). Further, the semiconductor layer 114 can be subjected to planarization treatment. The planarization treatment can be performed by CMP, etching treatment, or laser light irradiation, as described in Embodiment 1. After the planarization treatment, thinning treatment may be performed.

Through the above steps, the SOI substrate can be manufactured. The base substrate is subjected to plasma treatment, whereby unevenness and particles on the surface of the base substrate can be suppressed. Further, planarity of the base substrate is improved; thus, planarity of the nitrogen-containing layer can be improved in the case where the nitrogen-containing layer is formed over the base substrate. Furthermore, at least one of the nitrogen-containing layer formed over the base substrate and the oxide film formed on the semiconductor substrate is subjected to plasma treatment, whereby unevenness and particles on the surface of the nitrogen-containing layer or the oxide film can be suppressed. Moreover, planarity of the nitrogen-containing layer or the oxide film that is subjected to plasma treatment is improved; thus, hydrophilicity of the nitrogen-containing layer or the oxide film can be improved. As a result, in a step for bonding the semiconductor substrate to the base substrate, hydrogen bonding is highly likely to occur at a bonding interface and bonding strength between the base substrate and the semiconductor substrate can be improved. Thus, the SOI substrate can be manufactured in which adhesiveness between the semiconductor layer and the base substrate is improved; defective bonding is suppressed; and sufficient bonding strength is provided in a bonding step and also in a process for manufacturing a semiconductor device.

Note that the method for manufacturing an SOI substrate described in this embodiment can be appropriately combined with manufacturing methods in other embodiments of this specification.

Embodiment 3

In this embodiment, a method for manufacturing an SOI substrate, which is different from that in the above embodiments, is described with reference to drawings. Specifically, a case is described in which a nitrogen-containing layer is subjected to plasma treatment after the nitrogen-containing layer is formed over a base substrate.

Figures 1, 22A:
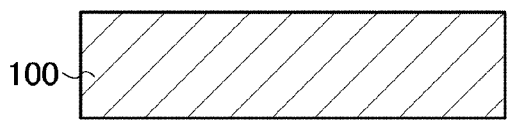
Figures 2, 22A:
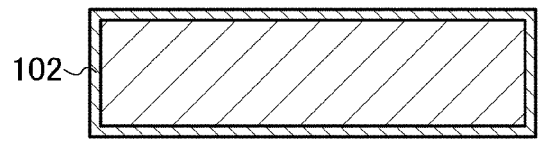
Figures 3, 22A:
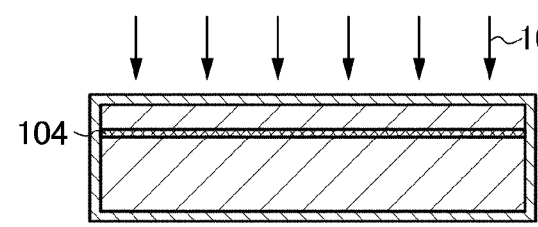
Figures 4, 22A:
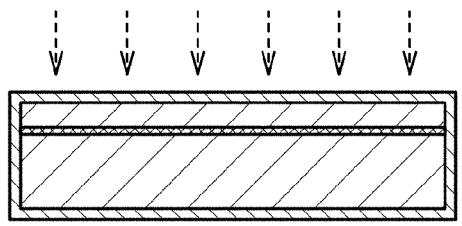

First, the semiconductor substrate 100 whose surface is provided with the oxide film 102 and in which the embrittled region 104 is provided at a predetermined depth is prepared (see FIGS. 22A-1 to 22A-3). Note that, steps illustrated in FIGS. 22A-1 to 22A-3 can be performed in a similar manner to those illustrated in FIGS. 1A-1 to 1A-3.

Figures 1, 22B:
Figures 2, 22B:
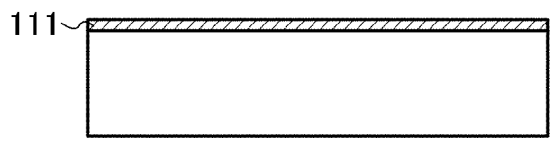
Figures 3, 22B:
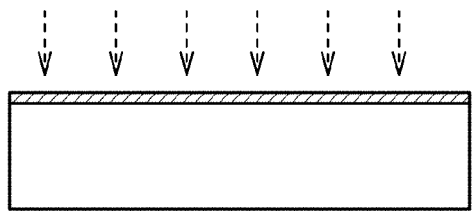

Next, after the base substrate is prepared (see FIG. 22B-1), the nitrogen-containing layer 111 is formed over the surface of the base substrate 110 (see FIG. 22B-2). Note that the step illustrated in FIG. 22B-2 can be performed in a similar manner to that illustrated in FIG. 2B-2.

Next, it is preferable that at least one of the surfaces of the oxide film 102 formed on the semiconductor substrate 100 and the nitrogen-containing layer 111 formed over the base substrate 110 be subjected to plasma treatment. Both of the surfaces of the oxide film 102 formed on the semiconductor substrate 100 and the nitrogen-containing layer 111 formed over the base substrate 110 may be subjected to plasma treatment (see FIGS. 22A-4 and 22B-3).

In this embodiment, in a similar manner to Embodiment 1, plasma treatment is performed by an inductively coupled plasma (ICP) method. The plasma treatment is performed in a plasma state by introducing an inert gas (for example, an Ar gas) into a chamber in a vacuum state and applying a bias voltage to a surface to be processed (here, the nitrogen-containing layer 111). Electrons and Ar cations are present in plasma, and Ar cations are accelerated in a cathode direction (to an object to be processed side). The accelerated Ar cations collide with the surface to be processed, whereby the surface to be processed is etched by sputtering. At this time, a projection of the surface to be processed is preferentially etched by sputtering; thus, planarity of the surface to be processed can be improved. Further, by the accelerated Ar cations, impurities such as organic substances over the surface to be processed can be removed and the surface to be processed can be activated. Furthermore, plasma treatment may be performed in a plasma state by introducing a reactive gas (for example, an $O_2$ gas or an $N_2$ gas) as well as an inert gas into a chamber in a vacuum state and applying a bias voltage to a surface to be processed. In the case where a reactive gas is introduced, defects caused by etching of the surface to be processed by sputtering can be repaired.

The surface of the oxide film 102 formed on the semiconductor substrate 100 or the surface of the nitrogen-containing layer 111 formed over the base substrate 110 are subjected to plasma treatment, whereby the average surface roughness ($R_a$) and the maximum peak-to-valley height (P-V) on the surface can be reduced. In addition, in the case where the nitrogen-containing layer 111 formed over the base substrate 110 is subjected to plasma treatment, the accelerated argon cations collide with the surface of the nitrogen-containing layer 111, whereby SiNO components or SiN components on the surface of the nitrogen-containing layer 111 are decreased. Accordingly, $SiO_2$ (X>0) components can be increased. That is, the number of hydrophilic groups on the surface of the nitrogen-containing layer 111 can be increased and the number of hydrogen bonds on a bonding surface can be increased; therefore, bonding strength can be improved.

Next, it is preferable that the oxide film 102 formed on the semiconductor substrate 100 and the nitrogen-containing layer 111 formed over the base substrate 110 be subjected to surface treatment before the semiconductor substrate 100 and the base substrate 110 are bonded to each other. The surface treatment method is described in Embodiment 1; thus, specific description thereof is omitted.

Figure 22C:
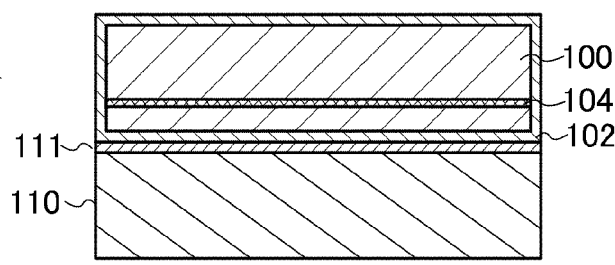
Figure 22D:
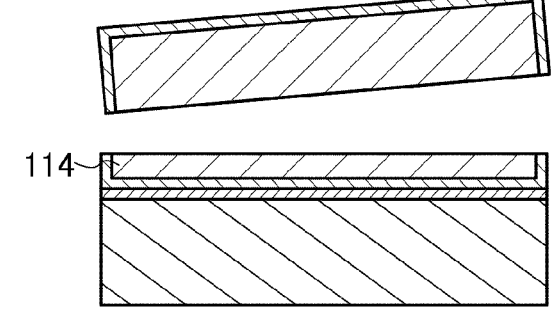

After that, the surface of the semiconductor substrate 100 and the surface of the base substrate 110 are disposed opposite to each other and the surface of the oxide film 102 and the surface of the nitrogen-containing layer 111 are bonded to each other (see FIG. 22C). Subsequently, by separation along the embrittled region 104 by heat treatment, the semiconductor layer 114 is provided over the base substrate 110 with the nitrogen-containing layer 111 and the oxide film 102 interposed therebetween (see FIG. 22D). Further, the semiconductor layer 114 can be subjected to planarization treatment. The planarization treatment can be performed by CMP, etching treatment, or laser light irradiation, as described in Embodiment 1. After the planarization treatment, thinning treatment may be performed.

Through the above steps, the SOI substrate can be manufactured. At least one of the nitrogen-containing layer formed over the base substrate and the oxide film formed on the semiconductor substrate is subjected to plasma treatment, whereby unevenness and particles on the surface of the nitrogen-containing layer or the oxide film can be suppressed. Moreover, planarity of the nitrogen-containing layer or the oxide film is improved; thus, hydrophilicity of the nitrogen-containing layer or the oxide film can be improved. As a result, in a step for bonding the semiconductor substrate to the base substrate, hydrogen bonding is highly likely to occur at a bonding interface and bonding strength between the base substrate and the semiconductor substrate can be improved. Thus, the SOI substrate can be manufactured in which adhesiveness between the semiconductor layer and the base substrate is improved; defective bonding is suppressed; and sufficient bonding strength is provided in a bonding step and also in a process for manufacturing a semiconductor device.

Note that the method for manufacturing an SOI substrate described in this embodiment can be appropriately combined with manufacturing methods in other embodiments of this specification.

Embodiment 4

In this embodiment, a method for manufacturing an SOI substrate, which is different from that in the above embodiments, is described with reference to drawings. Specifically, a case is described in which a plurality of semiconductor substrates are bonded to one base substrate.

Figure 3A:
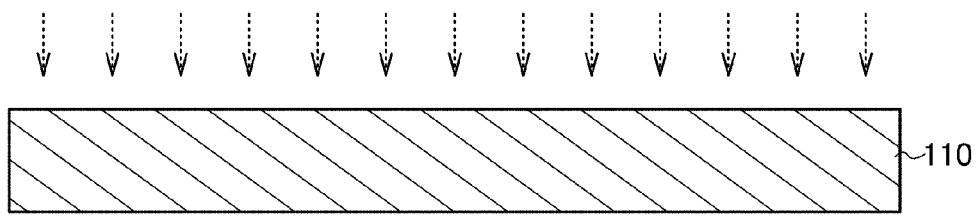
FIGS. 3A to 3D are diagrams illustrating an example of a method for manufacturing an SOI substrate according to one embodiment of the present invention.

First, the base substrate 110 is prepared and the surface of the base substrate 110 is subjected to plasma treatment (see FIG. 3A). Note that as described in Embodiment 2, a nitrogen-containing layer may be formed over the base substrate 110 after the surface of the base substrate 110 is subjected to plasma treatment, or as described in Embodiment 3, plasma treatment may be performed after a nitrogen-containing layer is formed over the base substrate 110. Plasma treatment can be performed on the base substrate in a similar manner to Embodiments 1 to 3; thus, specific description thereof is omitted.

Figure 3B:
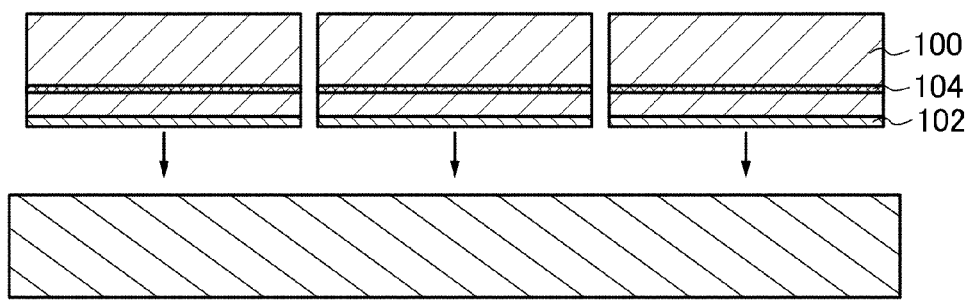
Figure 3C:
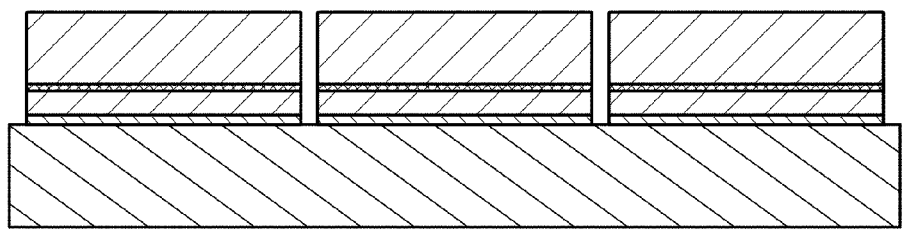

Next, the plurality of semiconductor substrates 100 whose surfaces are each provided with the oxide film 102 and each in which the embrittled region 104 is provided at a predetermined depth are prepared (see FIG. 3B). The plurality of semiconductor substrates 100 are bonded to the base substrate 110 (see FIG. 3C). Here, the oxide film 102 formed on the semiconductor substrate 100 and the base substrate 110 are bonded to each other. Note that the oxide film 102 formed on each of the plurality of semiconductor substrates 100 may be subjected to plasma treatment before the plurality of semiconductor substrates 100 and the base substrate 110 are bonded to each other. The oxide film 102 can be subjected to plasma treatment in a similar manner to Embodiments 1 to 3; thus, specific description thereof is omitted.

Figure 3D:
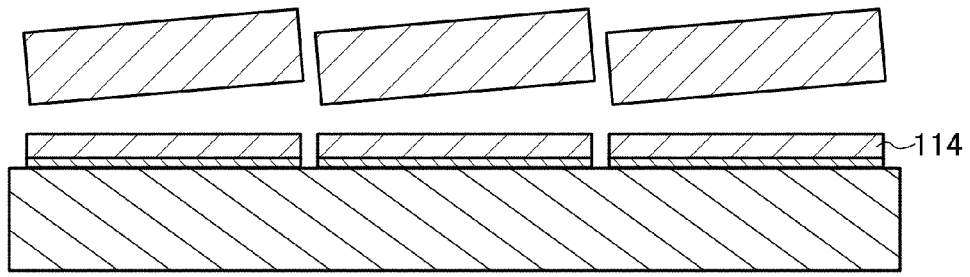

Then, by separation (cleavage) along the embrittled region 104 by heat treatment, the plurality of semiconductor layers 114 are provided over the base substrate 110 with the oxide films 102 interposed therebetween (see FIG. 3D). Further, the semiconductor layers 114 can also be subjected to planarization treatment. The planarization treatment can be performed by CMP, etching treatment, or laser light irradiation, as described in Embodiment 1. After the planarization treatment, thinning treatment may be performed.

In addition, in the case where the plurality of semiconductor substrates are bonded to one base substrate, the nitrogen-containing layer that functions as a barrier layer is formed on the base substrate 110 side that is larger in size. Accordingly, a barrier layer can also be formed in a region where the semiconductor layer 114 is not provided (spaces between the plurality of semiconductor layers 114), as compared to a structure in which the nitrogen-containing layer is formed on only the semiconductor substrate side. Thus, impurities from the spaces can be effectively prevented from diffusing into the semiconductor layer 114.

Through the above steps, the SOI substrate can be manufactured in which the plurality of semiconductor layers are provided over one base substrate. At least one of the nitrogen-containing layer formed over the base substrate and the oxide film formed on the semiconductor substrate is subjected to plasma treatment, whereby unevenness and particles on the surface of the nitrogen-containing layer or the oxide film can be suppressed. Moreover, planarity of the nitrogen-containing layer or the oxide film is improved; thus, hydrophilicity of the nitrogen-containing layer or the oxide film can be improved. As a result, in a step for bonding the semiconductor substrate to the base substrate, hydrogen bonding is highly likely to occur at a bonding interface and bonding strength between the base substrate and the semiconductor substrate can be improved. Thus, the SOI substrate can be manufactured in which adhesiveness between the semiconductor layer and the base substrate is improved; defective bonding is suppressed; and sufficient bonding strength is provided in a bonding step and also in a process for manufacturing a semiconductor device.

Note that the method for manufacturing an SOI substrate described in this embodiment can be appropriately combined with manufacturing methods in other embodiments of this specification.

Embodiment 5

In this embodiment, a method for manufacturing a semiconductor device using the SOI substrate manufactured in any one of the above-described embodiments is described.

First, a method for manufacturing an n-channel thin film transistor and a p-channel thin film transistor is described with reference to FIGS. 4A to 4E and FIGS. 5A to 5C. By combining a plurality of thin film transistors (TFTs), various types of semiconductor devices can be formed.

A case is described in which the SOI substrate manufactured by the method in Embodiment 1 is used as an SOI substrate. It is needless to say that the SOI substrate manufactured by the method in Embodiments 2 and 3 can also be used.

Figure 4A:
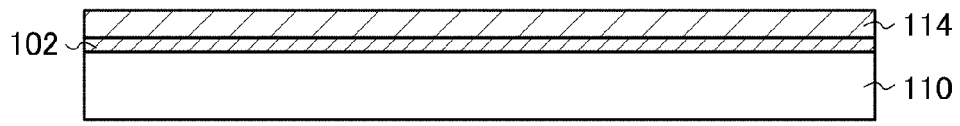
FIGS. 4A to 4E are diagrams illustrating an example of a method for manufacturing an SOI substrate according to one embodiment of the present invention.

FIG. 4A is a cross-sectional view of the SOI substrate manufactured by the method described with reference to FIGS. 1A-1 to 1A-4, 1B-1 and 1B-2, 1C, and 1D.

Figure 4B:
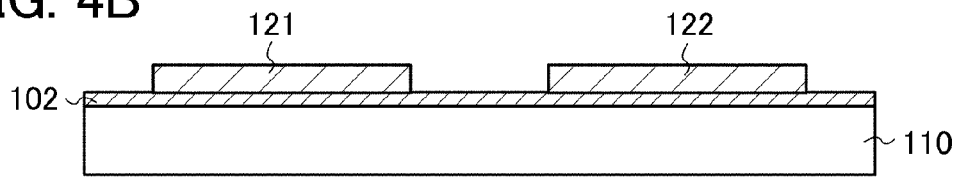

By element isolation of the semiconductor layer 114 by etching, semiconductor layers 121 and 122 are formed as illustrated in FIG. 4B. The semiconductor layer 121 is used for forming an n-channel TFT, and the semiconductor layer 122 is used for forming a p-channel TFT.

Figure 4C:
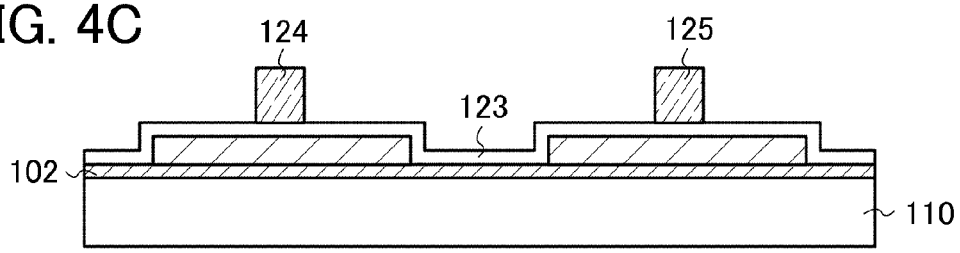

As illustrated in FIG. 4C, an insulating film 123 is formed over the semiconductor layers 121 and 122. Next, gate electrodes 124 and 125 are formed over the semiconductor layers 121 and 122 respectively with the insulating film 123 interposed therebetween.

Note that, before the semiconductor layer 114 is etched, it is preferable to add an impurity element such as boron, aluminum, or gallium or an impurity element such as phosphorus or arsenic to the semiconductor layer 114 in order to control the threshold voltage of TFTs. For example, an impurity element such as boron, aluminum, or gallium is added to a region where an n-channel TFT is to be formed, and an impurity element such as phosphorus or arsenic is added to a region where a p-channel TFT is to be formed.

Figure 4D:
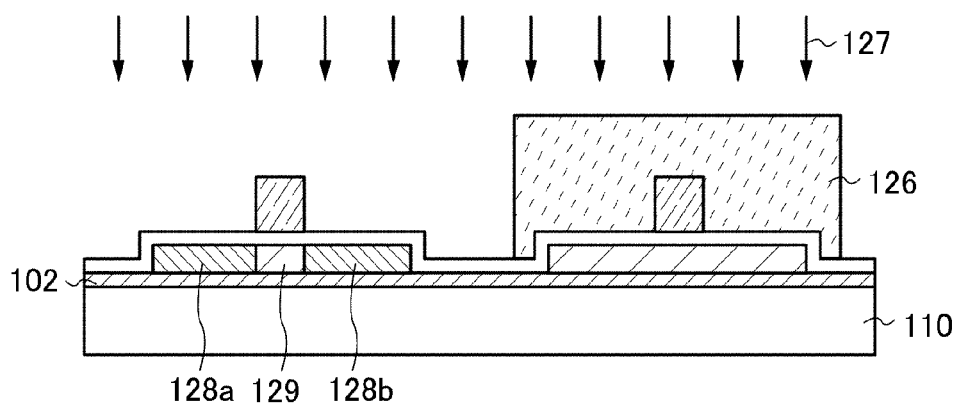
Figure 4E:
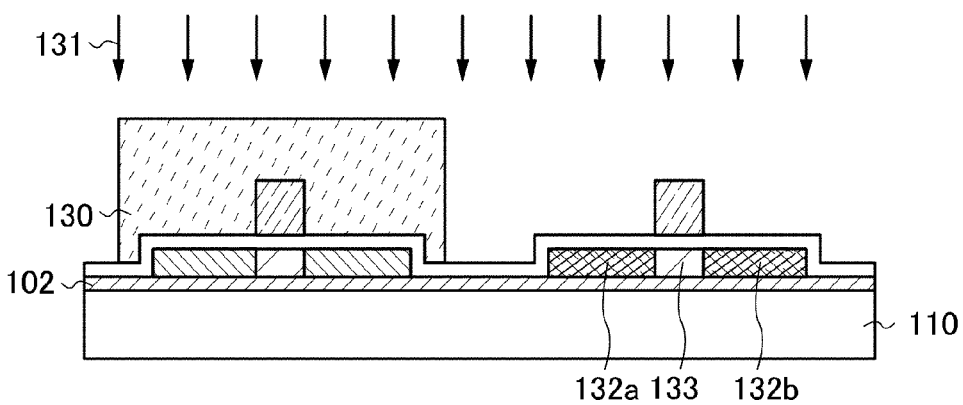

Next, as illustrated in FIG. 4D and FIG. 4E, n-type low-concentration impurity regions 128a and 128b are formed in the semiconductor layer 121, and p-type high-concentration impurity regions 132a and 132b are formed in the semiconductor layer 122. Specifically, first, the n-type low-concentration impurity regions 128a and 128b are formed in the semiconductor layer 121. In order to form the n-type low-concentration impurity regions 128a and 128b, the semiconductor layer 122 where a p-channel TFT is to be formed is covered with a resist mask 126, and an impurity element 127 is added to the semiconductor layer 121 (see FIG. 4D). As the impurity element, phosphorus or arsenic may be added. When the impurity element is added by an ion doping method or an ion implantation method, the gate electrode 124 serves as a mask, and the n-type low-concentration impurity regions 128a and 128b are formed in the semiconductor layer 121 in a self-aligned manner. A region of the semiconductor layer 121 which overlaps the gate electrode 124 serves as a channel formation region 129.

Next, after the resist mask 126 that covers the semiconductor layer 122 is removed, the semiconductor layer 121 where an n-channel TFT is to be formed is covered with a resist mask 130. Then, an impurity element 131 is added to the semiconductor layer 122 by an ion doping method or an ion implantation method (see FIG. 4E). As the impurity element 131, boron can be added. In the step of adding the impurity element, the gate electrode 125 serves as a mask, and the p-type high-concentration impurity regions 132a and 132b are formed in the semiconductor layer 122 in a self-aligned manner. The high-concentration impurity regions 132a and 132b function as a source region and a drain region. A region of the semiconductor layer 122 which overlaps the gate electrode 125 serves as a channel formation region 133. Here, the method is described in which the p-type high-concentration impurity regions 132a and 132b are formed after the n-type low-concentration impurity regions 128a and 128b are formed; however, the p-type high-concentration impurity regions 132a and 132b can be formed first.

Figure 5A:
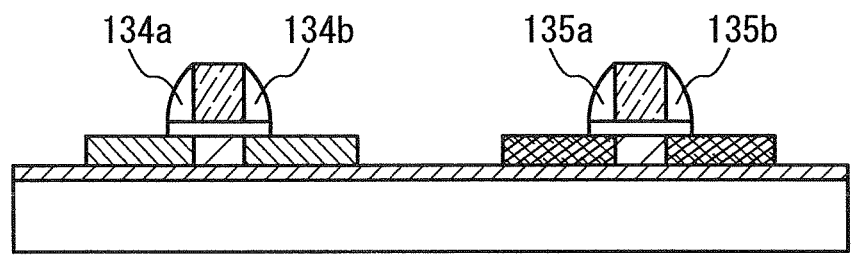
FIGS. 5A to 5C are diagrams illustrating an example of a method for manufacturing an SOI substrate according to one embodiment of the present invention.

Next, after the resist mask 130 that covers the semiconductor layer 121 is removed, an insulating film having a single layer structure or a stacked layer structure, which includes a nitrogen compound such as silicon nitride or an oxide such as silicon oxide, is formed by a plasma CVD method or the like. This insulating film is anisotropically etched in a perpendicular direction, whereby sidewall insulating films 134a, 134b, 135a, and 135b are formed in contact with side surfaces of the gate electrodes 124 and 125 respectively, as illustrated in FIG. 5A. By this anisotropic etching, the insulating film 123 is also etched.

Figure 5B:
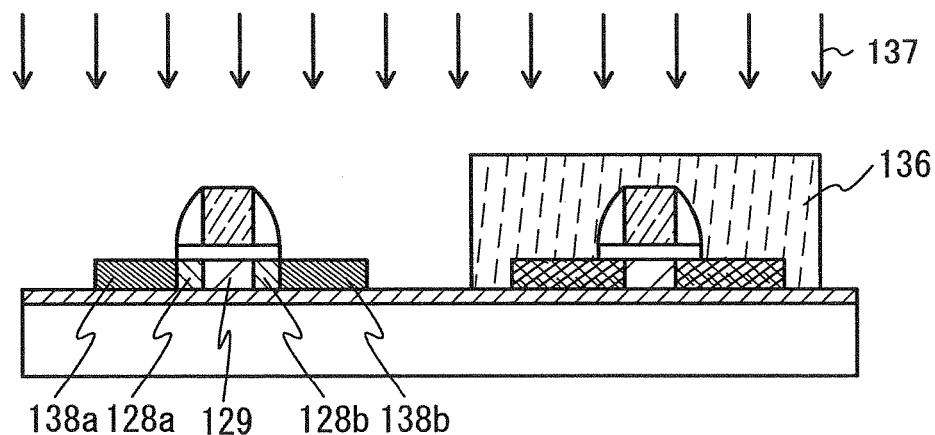

Next, as illustrated in FIG. 5B, the semiconductor layer 122 is covered with a resist 136. In order to form high-concentration impurity regions functioning as a source region and a drain region in the semiconductor layer 121, an impurity element 137 is added to the semiconductor layer 121 at high dose by an ion implantation method or an ion doping method. The gate electrode 124 and the sidewall insulating films 134a and 134b function as a mask, and n-type high-concentration impurity regions 138a and 138b are formed. Next, heat treatment for activating the impurity elements is performed.

Figure 5C:
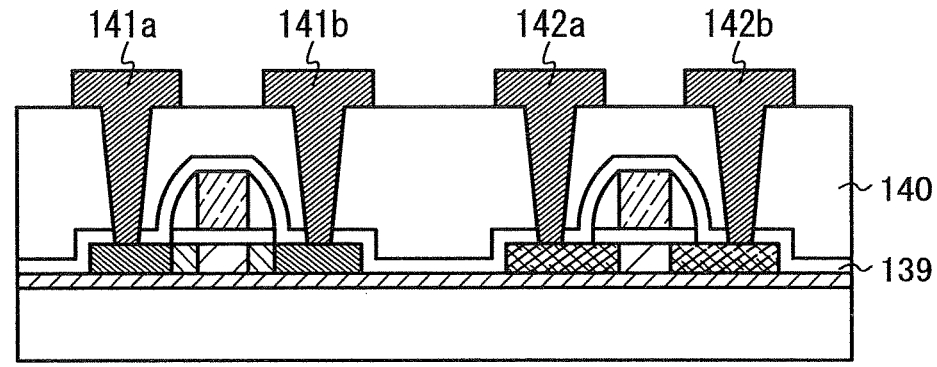

After the heat treatment for activation, an insulating film 139 containing hydrogen is formed as illustrated in FIG. 5C. After the insulating film 139 is formed, heat treatment is performed at a temperature of greater than or equal to 350° C. and less than or equal to 450° C. so that hydrogen contained in the insulating film 139 diffuses into the semiconductor layers 121 and 122. The insulating film 139 can be formed by deposition of silicon nitride or silicon nitride oxide by a plasma CVD method at a process temperature of 350° C. or less. By supply of hydrogen to the semiconductor layers 121 and 122, defects to serve as trapping centers in the semiconductor layers 121 and 122 and at the interface with the insulating film 123 can be repaired effectively.

After that, an interlayer insulating film 140 is formed. The interlayer insulating film 140 can be formed with a film having a single layer structure or a stacked layer structure selected from insulating films of inorganic materials, such as a silicon oxide film and a borophosphosilicate glass (BPSG) film, and organic resin films of polyimide, acrylic, and the like. Contact holes are formed in the interlayer insulating film 140, and wirings 141a, 141b, 142a, and 142b are then formed as illustrated in FIG. 5C. The wirings 141a, 141b, 142a, and 142b can be formed with a conductive film with a three-layer structure in which a low-resistance metal film such as an aluminum film or an aluminum-alloy film is sandwiched between barrier metal films. The barrier metal films can each be formed using a metal film of molybdenum, chromium, titanium, or the like.

Through the steps described above, a semiconductor device having the n-channel TFT and the p-channel TFT can be manufactured. Because the metal element concentration of the semiconductor layer in which the channel formation region is formed is reduced in the process for manufacturing the SOI substrate, a TFT with small off current and suppressed threshold voltage variation can be manufactured.

Although the method for manufacturing TFTs is described with reference to FIGS. 4A to 4E and FIGS. 5A to 5C, a semiconductor device with high added value can be manufactured by forming a variety of semiconductor elements such as a capacitor or a resistor as well as a TFT. Specific modes of semiconductor devices are described below with reference to drawings.

Figure 6:
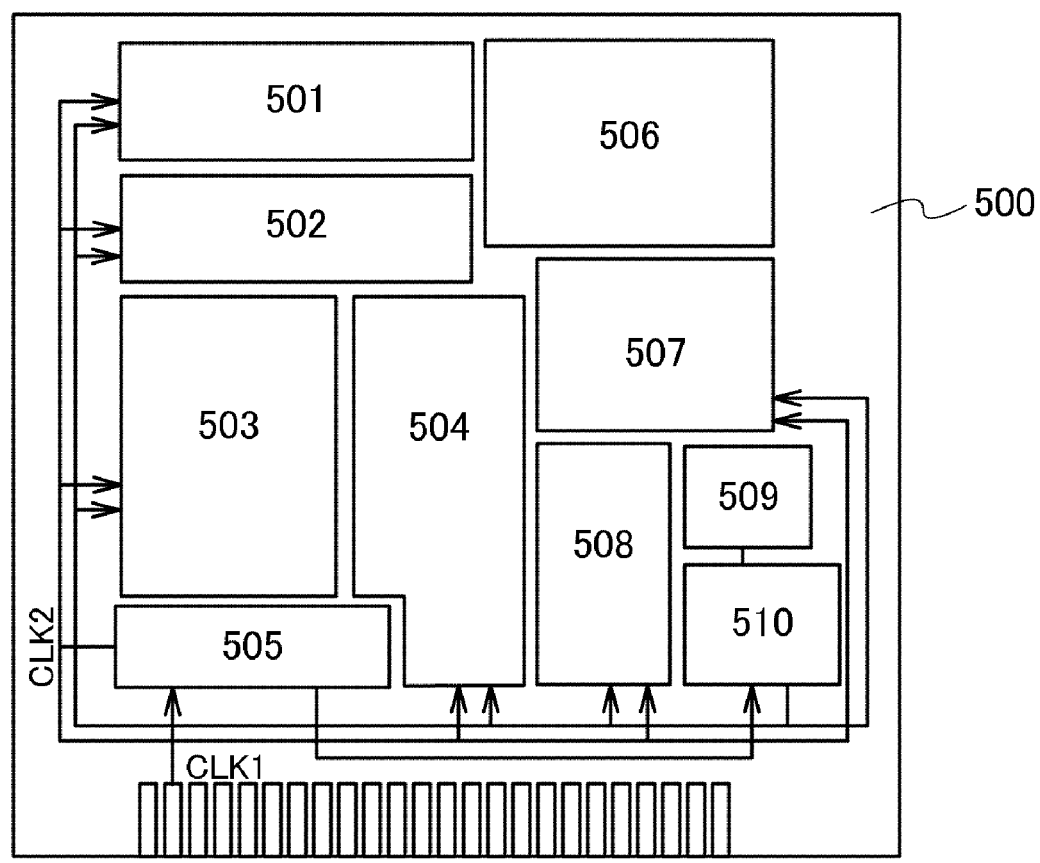
FIG. 6 is a diagram illustrating an example of a semiconductor device using an SOI substrate according to one embodiment of the present invention.

First, a microprocessor is described as an example of semiconductor devices. FIG. 6 is a block diagram illustrating an example of a structure of a microprocessor 500.

The microprocessor 500 has an arithmetic logic unit (also referred to as an "ALU") 501, an ALU controller 502, an instruction decoder 503, an interrupt controller 504, a timing controller 505, a register 506, a register controller 507, a bus interface (Bus I/F) 508, a read-only memory (also referred to as an "ROM") 509, and a memory interface (also referred to as an "ROM interface") 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 6, the internal clock signal CLK2 is input to other circuits.

Figure 7:
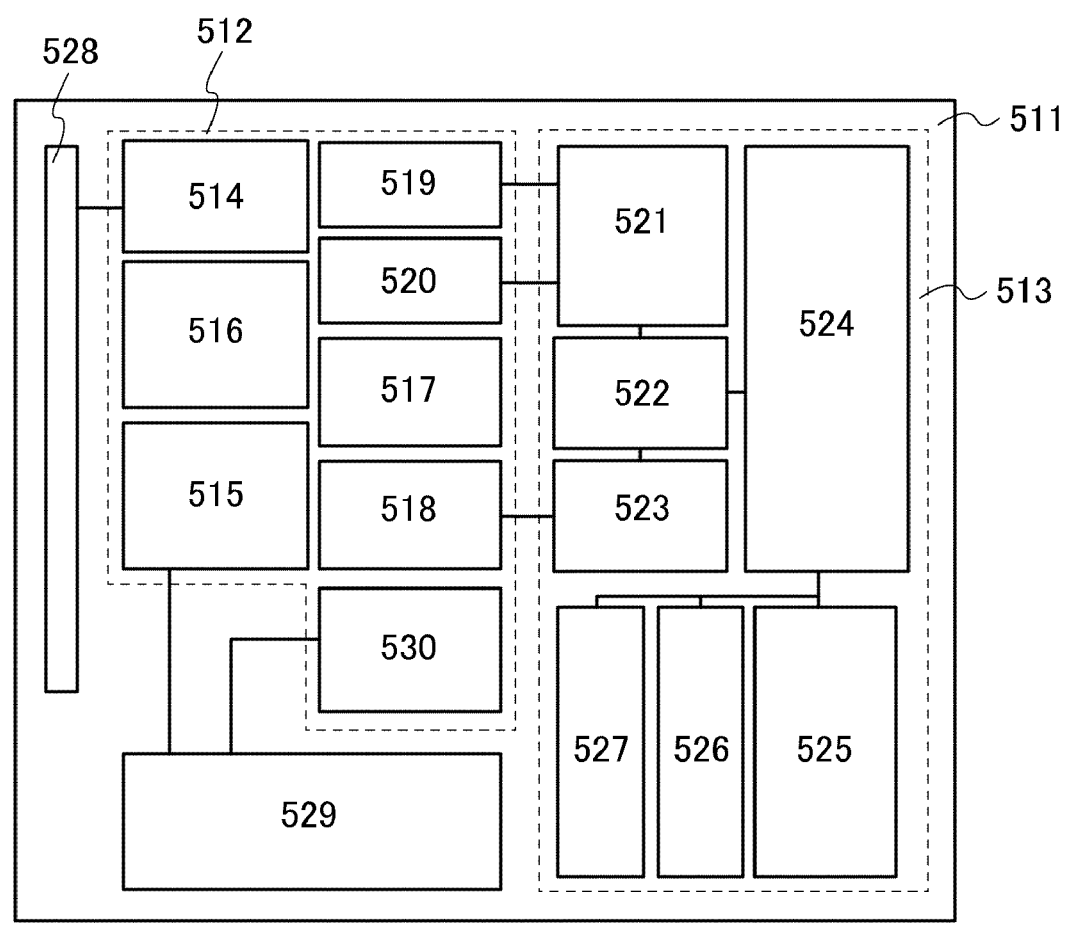
FIG. 7 is a diagram illustrating an example of a semiconductor device using an SOI substrate according to one embodiment of the present invention.

Next, an example of a semiconductor device having an arithmetic function and a contactless data transmission and reception function is described. FIG. 7 is a block diagram illustrating an example of a structure of such a semiconductor device. A semiconductor device illustrated in FIG. 7 can be called a computer that operates to transmit and receive signals to and from an external device by wireless communication (such a computer is hereinafter referred to as an "RFCPU").

As illustrated in FIG. 7, an RFCPU 511 has an analog circuit portion 512 and a digital circuit portion 513. The analog circuit portion 512 has a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 has an RF interface 521, a control register 522, a clock controller 523, a CPU interface 524, a central processing unit (also referred to as a "CPU") 525, a random-access memory (also referred to as a "RAM") 526, and a read-only memory (also referred to as a "ROM") 527.

The operation of the RFCPU 511 is roughly as follows. The resonance circuit 514 generates an induced electromotive force based on a signal received by an antenna 528. The induced electromotive force is stored in a capacitor portion 529 through the rectifier circuit 515. This capacitor portion 529 is preferably formed with a capacitor such as a ceramic capacitor or an electric double layer capacitor. The capacitor portion 529 does not need to be formed over a substrate included in the RFCPU 511 and can be incorporated in the RFCPU 511 as a separate component.

The reset circuit 517 generates a signal for resetting and initializing the digital circuit portion 513. For example, the reset circuit 517 generates a signal which rises after a rise in a power supply voltage with delay as a reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed with a low-pass filter and binarizes a received amplitude-modulated (ASK) signal based on variation of its amplitude. The modulator circuit 520 varies the amplitude of an amplitude-modulated (ASK) transmission signal and transmits the signal. The modulator circuit 520 changes the amplitude of a communication signal by changing a resonance point of the resonance circuit 514.

The clock controller 523 generates a control signal for changing the frequency and duty ratio of a clock signal in accordance with the power supply voltage or a consumption current of the central processing unit 525. The power supply voltage is monitored by the power management circuit 530.

A signal input to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the CPU interface 524. The CPU interface 524 functions to generate an access signal for any of the read-only memory 527, the random-access memory 526, and the control register 522 based on an address which the central processing unit 525 requests.

As an arithmetic method of the central processing unit 525, a method may be employed in which the read-only memory 527 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Next, display devices are described with reference to FIGS. 8A and 8B and FIGS. 9A and 9B.

Figure 8A:
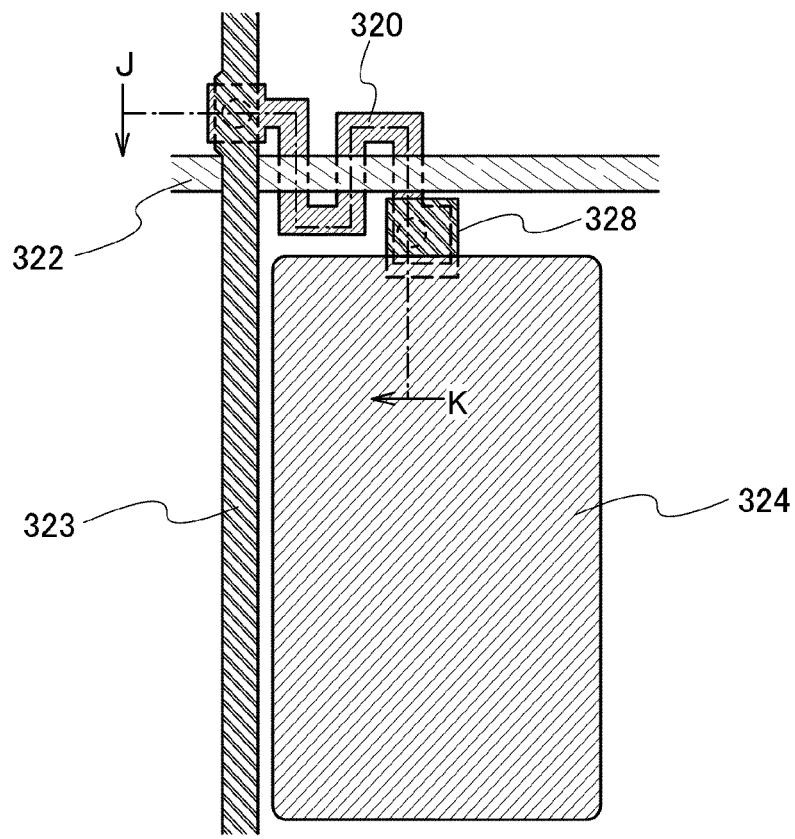
FIGS. 8A and 8B are diagrams illustrating an example of a display device using an SOI substrate according to one embodiment of the present invention.
Figure 8B:
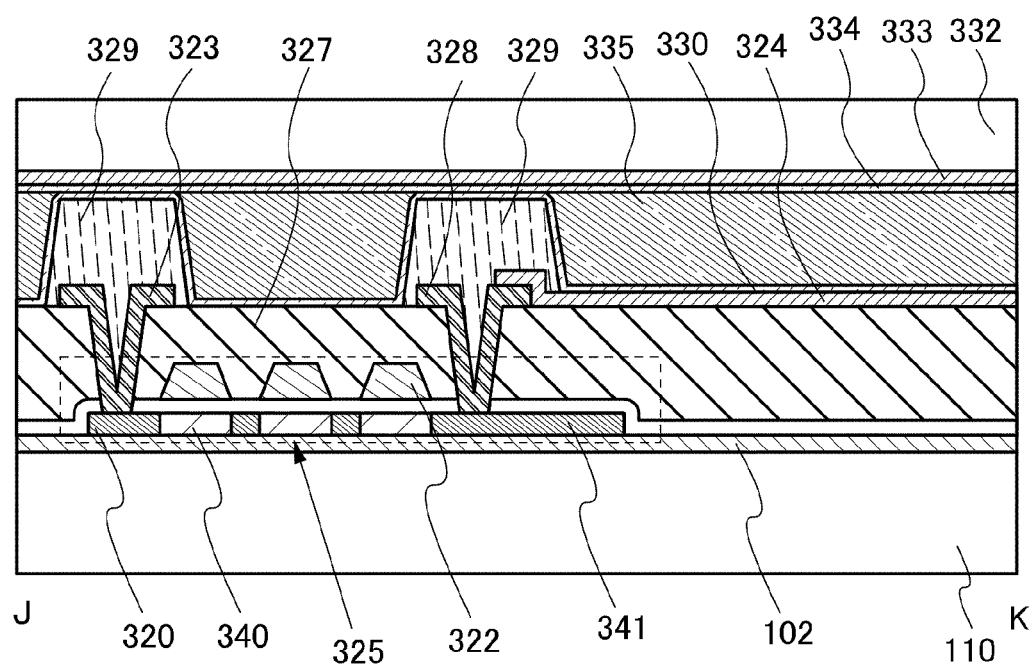

FIGS. 8A and 8B are drawings for describing a liquid crystal display device. FIG. 8A is a plan view of a pixel of the liquid crystal display device, and FIG. 8B is a cross-sectional view of FIG. 8A taken along a section line J-K.

As illustrated in FIG. 8A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 to the single crystal semiconductor layer 320. The single crystal semiconductor layer 320 is a layer formed of the single crystal semiconductor layer provided over the base substrate 110 and is included in a TFT 325 of the pixel.

As an SOI substrate, the SOI substrate described in either one of Embodiments 1 to 4 is used. As illustrated in FIG. 8B, the single crystal semiconductor layer 320 is stacked over the base substrate 110 with the oxide film 102 interposed therebetween. As the base substrate 110, a glass substrate can be used. The single crystal semiconductor layer 320 of the TFT 325 is formed by element isolation of the single crystal semiconductor layer of the SOI substrate by etching. In the single crystal semiconductor layer 320, channel formation regions 340 and n-type high-concentration impurity regions 341 to which an impurity element is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 which covers the counter electrode 333 are formed. The columnar spacers 329 are formed to maintain a space between the base substrate 110 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 in these connection portions becomes disordered easily. Accordingly, the columnar spacers 329 are formed in these step portions to prevent orientation disorder of liquid crystal. A liquid crystal display device is manufactured by employing the process for manufacturing the SOI substrate according to one embodiment of the present invention; accordingly, display unevenness due to defective bonding can be suppressed.

Figure 9A:
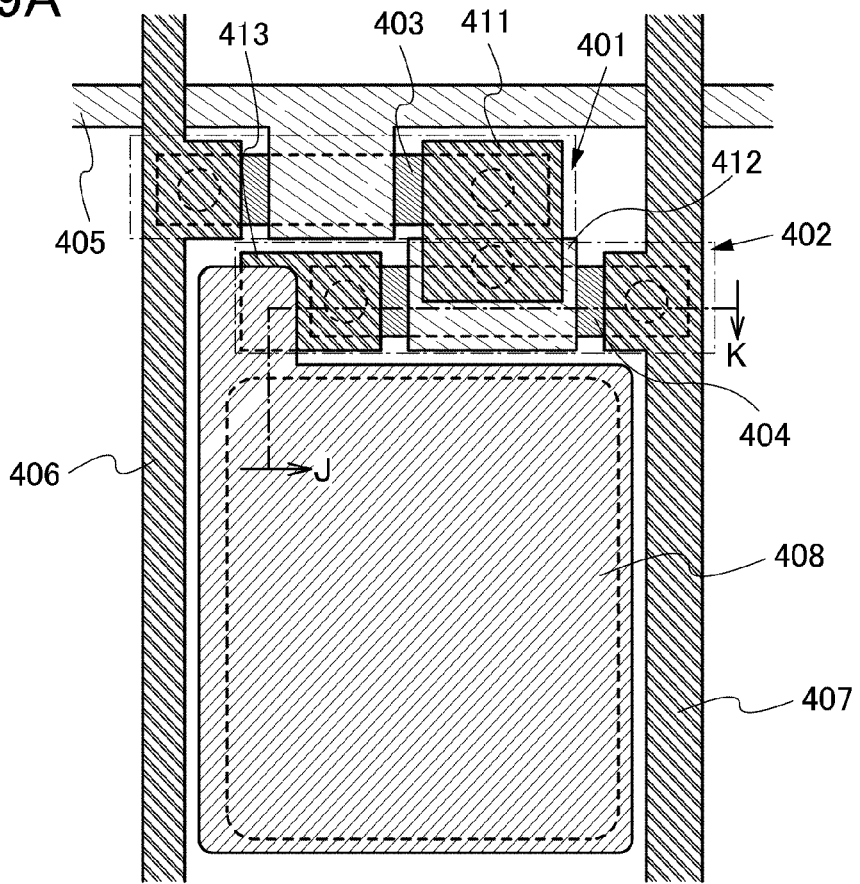
FIGS. 9A and 9B are diagrams illustrating an example of a display device using an SOI substrate according to one embodiment of the present invention.
Figure 9B:
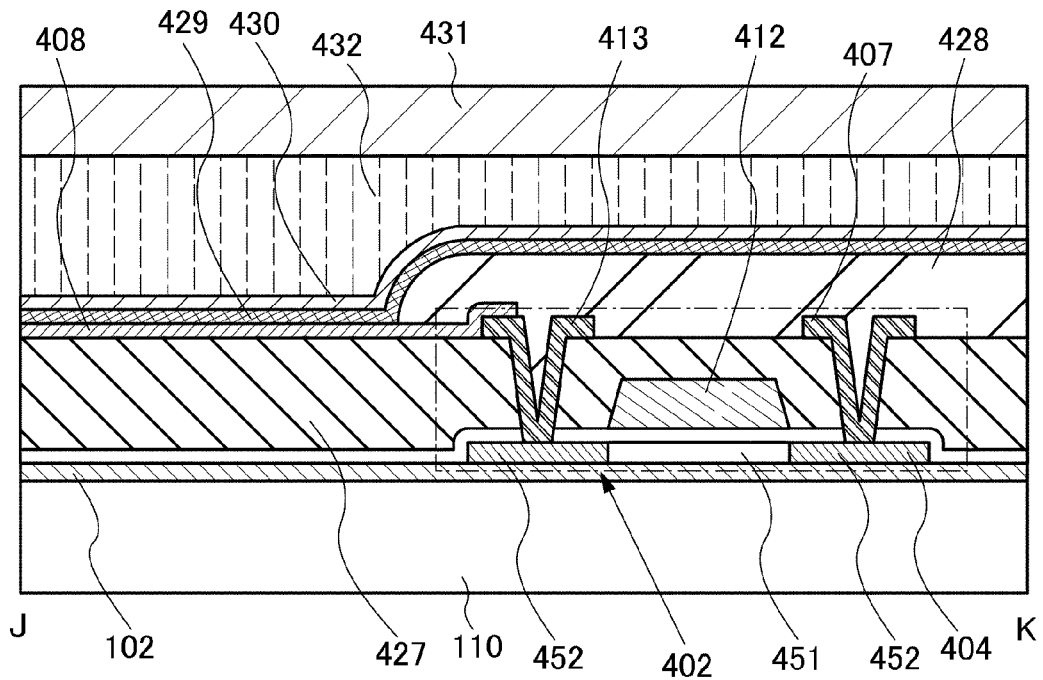

Next, an electroluminescent display device (hereinafter referred to as an "EL display device") is described with reference to FIGS. 9A and 9B. FIG. 9A is a plan view of a pixel of the EL display device, and FIG. 9B is a cross-sectional view of FIG. 9A taken along a section line J-K.

As illustrated in FIG. 9A, the pixel includes a selecting transistor 401 and a display control transistor 402 that are TFTs, a scan line 405, a signal line 406, a current supply line 407, and a pixel electrode 408. Each pixel is provided with a light emitting element having a structure in which a layer containing an electroluminescent material (EL layer) is interposed between a pair of electrodes. One of the electrodes of the light emitting element is the pixel electrode 408. In a semiconductor layer 403, a channel formation region, a source region, and a drain region of the selecting transistor 401 are formed. In a semiconductor layer 404, a channel formation region, a source region, and a drain region of the display control transistor 402 are formed. The semiconductor layers 403 and 404 are formed of the single crystal semiconductor layer that is provided over the base substrate.

In the selecting transistor 401, a gate electrode is included in the scan line 405; one of a source electrode and a drain electrode is included in the signal line 406; and the other is formed as an electrode 411. In the display control transistor 402, a gate electrode 412 is electrically connected to the electrode 411; one of a source electrode and a drain electrode is formed as an electrode 413 which is electrically connected to the pixel electrode 408; and the other is included in the current supply line 407.

The display control transistor 402 is a p-channel TFT. As illustrated in FIG. 9B, in the semiconductor layer 404, a channel formation region 451 and p-type high-concentration impurity regions 452 are formed. Note that, as the SOI substrate, the SOI substrate manufactured in either one of Embodiments 1 to 4 is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to the base substrate 110 with a resin layer 432.

The grayscale of the EL display device is controlled by either a current drive method where the luminance of the light-emitting element is controlled by the amount of current or a voltage drive method where the luminance is controlled by the amount of voltage. The current drive method is difficult to employ when transistors have characteristics which largely vary from pixel to pixel. In order to employ the current drive method, a correction circuit which corrects characteristic variation is needed. An EL display device is manufactured by employing the process for manufacturing the SOI substrate according to one embodiment of the present invention; accordingly, display unevenness due to defective bonding can be suppressed.

That is, various electronic devices can be manufactured by using SOI substrates. Examples of electronic devices include: cameras such as video cameras and digital cameras; navigation systems; sound reproduction devices (car audio systems, audio components, and the like); computers; game machines; portable information terminals (mobile computers, cellular phones, portable game machines, electronic book readers, and the like); image reproduction devices provided with recording media (specifically, devices which are each capable of reproducing audio data stored in a recording medium such as a digital versatile disc (DVD) and which each have a display device capable of displaying image data stored therein); and the like. An example of them is illustrated in FIGS. 10A to 10E.

Figure 10A:
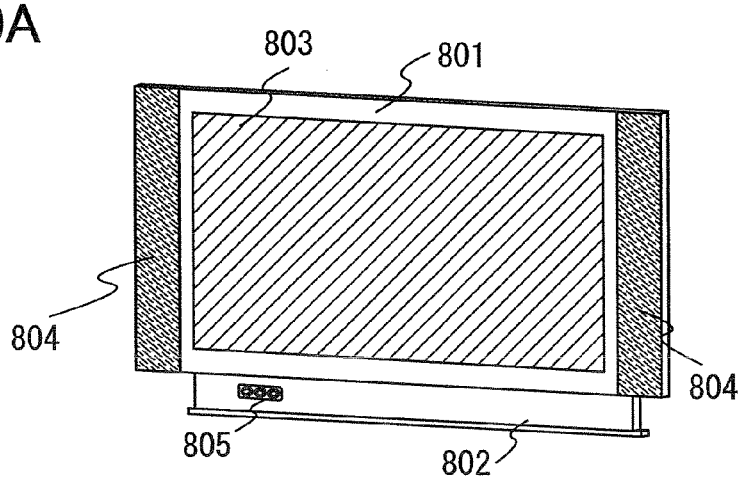
FIGS. 10A to 10E are diagrams illustrating an electronic device using an SOI substrate according to one embodiment of the present invention.

FIG. 10A illustrates a display device including a housing 801, a supporting base 802, a display portion 803, a speaker portion 804, a video input terminal 805, and the like. The display device is manufactured using a light-emitting device which is formed using one embodiment of the present invention for the display portion 803. Note that the category of the display device includes all types of information display devices, for example, display devices for a personal computer, display devices for TV broadcast reception, display devices for advertisement display, and the like. Application of one embodiment of the present invention makes it possible to achieve increase in use efficiency of materials and increase in manufacturing efficiency mainly in a deposition process of a light-emitting device. Accordingly, manufacturing costs can be reduced and productivity can be improved in manufacturing display devices; thus, inexpensive display devices can be provided.

Figure 10B:
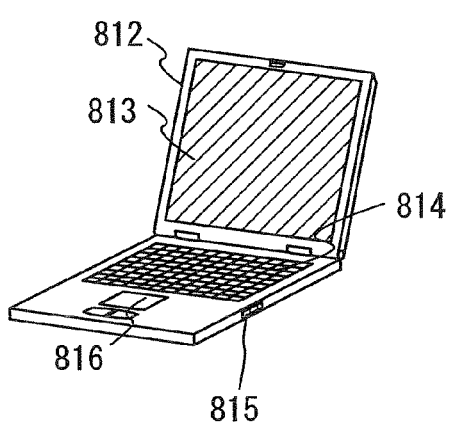

FIG. 10B illustrates a computer including a housing 812, a display portion 813, a keyboard 814, an external connection port 815, a mouse 816, and the like. Note that the computer is manufactured using a light-emitting device which is formed using one embodiment of the present invention for the display portion 813. Application of one embodiment of the present invention makes it possible to achieve increase in use efficiency of materials and increase in manufacturing efficiency mainly in a deposition process of a light-emitting device. Accordingly, manufacturing costs can be reduced and productivity can be improved in manufacturing computers; thus, inexpensive computers can be provided.

Figure 10C:
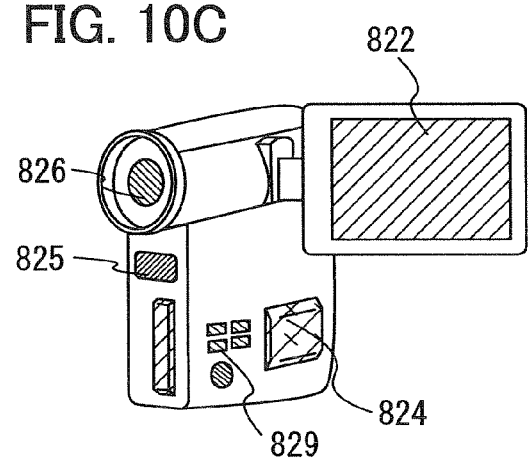

FIG. 10C illustrates a video camera including a display portion 822, an external connection port 824, a remote control receiving portion 825, an image receiving portion 826, operation keys 829, and the like. Note that the video camera is manufactured using a light-emitting device which is formed using one embodiment of the present invention for the display portion 822. Application of one embodiment of the present invention makes it possible to achieve increase in use efficiency of materials and increase in manufacturing efficiency mainly in a deposition process of a light-emitting device. Accordingly, manufacturing costs can be reduced and productivity can be improved in manufacturing video cameras; thus, inexpensive video cameras can be provided.

Figure 10D:
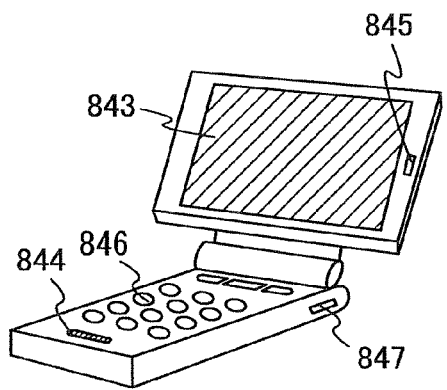

FIG. 10D illustrates a cellular phone including a display portion 843, an audio input portion 844, an audio output portion 845, operation keys 846, an external connection port 847, and the like. Note that the cellular phone is manufactured using a light-emitting device which is formed using one embodiment of the present invention for the display portion 843. Further, in addition to the above-described components, the cellular phone may also have an infrared communication function, a television reception function, or the like. Application of one embodiment of the present invention makes it possible to achieve increase in use efficiency of materials and increase in manufacturing efficiency mainly in a deposition process of a light-emitting device. Accordingly, manufacturing costs can be reduced and productivity can be improved in manufacturing cellular phones; thus, inexpensive cellular phones can be provided.

Figure 10E:
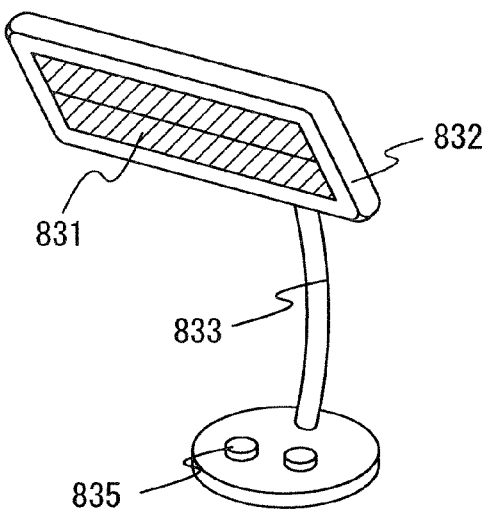

FIG. 10E illustrates a desk lamp including a lighting portion 831, a shade 832, an adjustable arm 833, a power supply 835, and the like. Note that the desk lamp is manufactured using a light-emitting device which is formed using one embodiment of the present invention for the display portion 831. Note that the category of lighting equipment includes a ceiling light, a wall light, and the like. Application of one embodiment of the present invention makes it possible to achieve increase in use efficiency of materials and increase in manufacturing efficiency mainly in a deposition process of a light-emitting device. Accordingly, manufacturing costs can be reduced and productivity can be improved in manufacturing desk lamps; thus, inexpensive desk lamps can be provided.

Figure 11A:
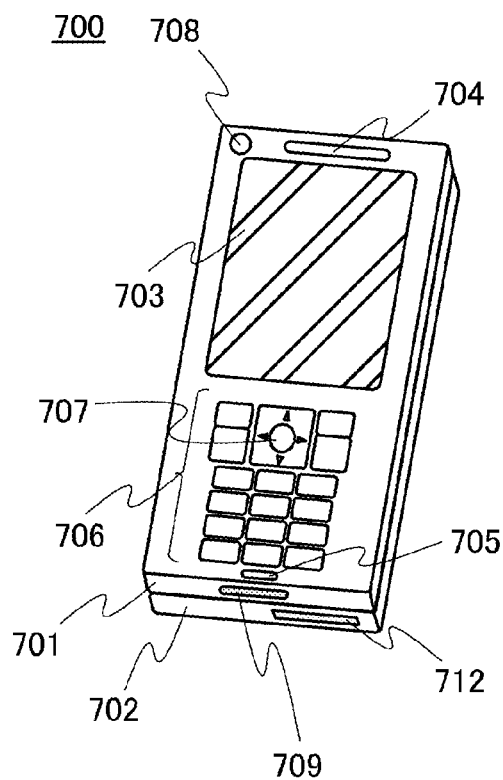
FIGS. 11A to 11C are diagrams illustrating an electronic device using an SOI substrate according to one embodiment of the present invention.
Figure 11B:
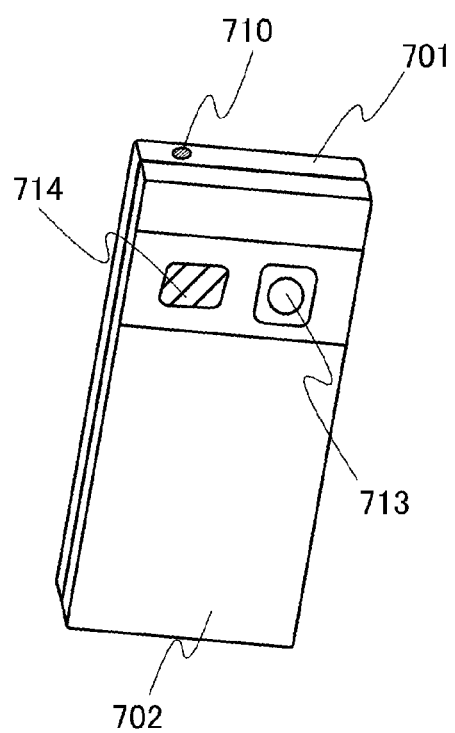
Figure 11C:
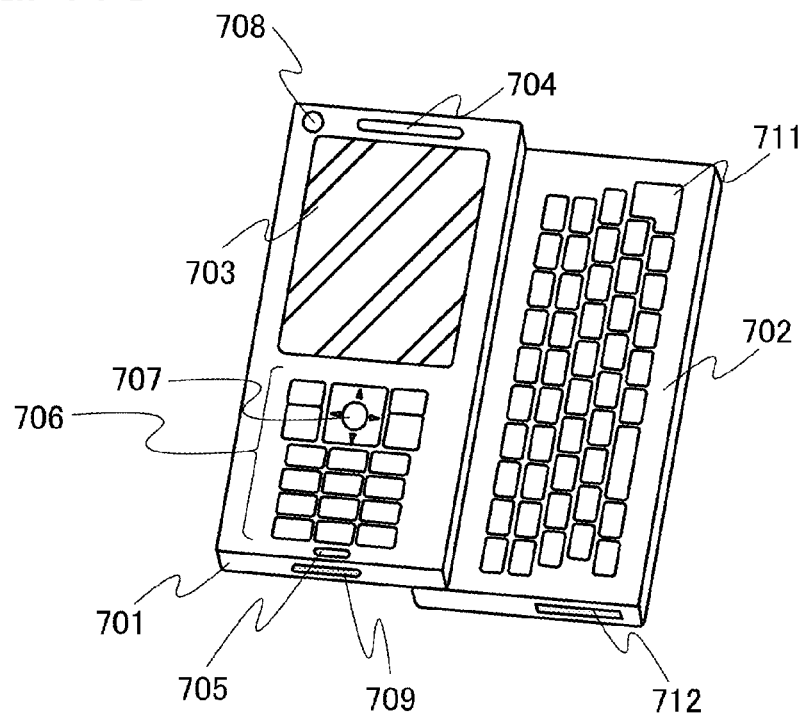

FIGS. 11A to 11C illustrate an example of a cellular phone to which one embodiment of the present invention is applied. FIG. 11A is a front view, FIG. 11B is a rear view, and FIG. 11C is a front view in which two housings are slid. A cellular phone 700 has two housings, a housing 701 and a housing 702. The cellular phone 700 is a so-called smartphone that has both a function as a cellular phone and a function as a portable information terminal and incorporates a computer provided to conduct a variety of data processing besides voice calls.

The cellular phone 700 has the housings 701 and 702. The housing 701 includes a display portion 703, a speaker 704, a microphone 705, operation keys 706, a pointing device 707, a front-face camera lens 708, an external connection terminal jack 709, an earphone terminal 710, and the like. The housing 702 includes a keyboard 711, an external memory slot 712, a rear-face camera 713, a light 714, and the like. In addition, an antenna is incorporated in the housing 701.

Further, in addition to the above-described components, the cellular phone 700 may incorporate a contactless IC chip, a small size memory device, or the like.

The housings 701 and 702 that are put together to be lapped with each other (see FIG. 11A) can be developed by sliding as illustrated in FIG. 11C. The display portion 703 can incorporate a display panel or a display device to which the method for manufacturing the display device described in either one of Embodiments 1 to 4 is applied. Because the display portion 703 and the front-face camera lens 708 are provided in the same plane, the cellular phone can be used as a videophone. In addition, still images and moving images can be taken with the rear-face camera 713 and the light 714 by using the display portion 703 as a viewfinder.

With the use of the speaker 704 and the microphone 705, the cellular phone 700 can be used as a sound recording device (recorder) or a sound reproducing device. By operation with the operation keys 706, operation of incoming and outgoing calls, simple information input for electronic mail or the like, scrolling of a viewing area displayed on the display portion, cursor motion for selecting information displayed on the display portion, and the like are possible.

If much information needs to be handled in documentation, a use as a portable information terminal, and the like, the use of the keyboard 711 is convenient. Further, the housings 701 and 702 that are put together to be lapped with each other (FIG. 11A) can be developed by sliding as illustrated in FIG. 11C. When the cellular phone is used as a portable information terminal, smooth cursor operation can be conducted using the keyboard 711 or the pointing device 707. The external connection terminal jack 709 can be connected to an AC adaptor and various types of cables such as a USB cable, and charging and data communication with a personal computer or the like are possible. Moreover, a recording medium can be inserted into the external memory slot 712 so that a large volume of data can be stored and moved.

The housing 702 is provided with the rear-face camera 713 and the light 714 on the rear face (FIG. 11B), and still images and moving images can be taken using the display portion 703 as a viewfinder.

Furthermore, in addition to the above-described functions, the cellular phone may also have an infrared communication function, a USB port, a television one-segment broadcasting receiving function, a contactless IC chip, an earphone jack, or the like.

Although in FIGS. 8A and 8B and FIGS. 9A and 9B, a display device is manufactured using the SOI substrate to which Embodiment 1 is applied, a display device can be manufactured using the SOI substrate to which another embodiment is applied. Further, the electronic device illustrated in FIGS. 10A to 10E and FIGS. 11A to 11C can be manufactured by application of the aforementioned method for manufacturing a transistor and a display device.

As described above, with the application of the SOI substrate according to one embodiment of the present invention, various electronic devices can be obtained. The application range of the light-emitting device according to one embodiment of the present invention is so wide that the light-emitting device can be applied to electronic devices in various fields.

Example 1

In this example, changes in surface characteristics when a surface of a base substrate is subjected to plasma treatment are described. In this example, a glass substrate is used as a base substrate.

A surface of a glass substrate was subjected to plasma treatment with different treatment time in order to measure the surface roughness of the glass substrate. Plasma treatment was performed using an apparatus manufactured by Tokyo Electron Limited (ME-500, an ICP plasma dry etching apparatus) by a method called inductively coupled plasma (ICP) under conditions with an ICP power of 500 W (0.11 W/cm$^2$), an RF bias voltage of 100 W (0.61 W/cm$^2$), a pressure of 1.35 Pa, and an argon gas flow rate of 100 sccm. Treatment time was set to 0, 2, 3, 4, 5, and 6, minutes.

In this example, for measurement of the surface roughness of a glass substrate, an atomic force microscope (AFM) was used in order to measure the average surface roughness ($R_a$) and the maximum peak-to-valley height (P-V) on the surface of the glass substrate.

In this example, the average surface roughness ($R_a$) is obtained by expanding into three dimensions center line average surface roughness $R_a$ that is defined by JIS B 0601:2001 (ISO 4287:1997) so as to be able to apply $R_a$ to a measurement surface. The $R_a$ can be expressed as an average value of the absolute values of deviations from a reference surface to a specific surface and can be obtained by the following formula.

$$R_a = \frac{1}{S_0} \int_{Y_1}^{Y_2} \int_{X_1}^{X_2} |F(X, Y) - Z_0| dX\, dY$$

Note that the measurement surface is a surface which is shown by all the measurement data, and is represented by the following formula.

$$Z = F(X, Y)$$

The specific surface is a surface which is an object of roughness measurement, and is a rectangular region which is surrounded by four points represented by the coordinates ($X_1$, $Y_1$), ($X_1$, $Y_2$), ($X_2$, $Y_1$), and ($X_2$, $Y_2$). The area of the specific surface when the specific surface is flat ideally is denoted by $S_0$. Note that $S_0$ is obtained by the following formula.

$$S_0 = (X_2 - X_1)(Y_2 - Y_1)$$

The root-mean-square surface roughness (RMS) is obtained by expanding into three dimensions the RMS of a cross section curve so as to be able to apply the RMS of a cross section curve to the measurement surface, in a similar manner to $R_a$. The RMS can be expressed as the square root of the average value of squares of deviations from the reference surface to the specific surface, and can be obtained by the following formula.

$$R_{ms} = \sqrt{\frac{1}{S_0} \int_{Y_1}^{Y_2} \int_{X_1}^{X_2} \{F(X, Y) - Z_0\}^2 dX\, dY}$$

The reference surface is a plane surface represented by $Z = Z_0$ when $Z_0$ is the average value of height of the specific surface. The reference surface is parallel to the XY plane. Note that $Z_0$ is obtained by the following formula.

$$Z_0 = \frac{1}{S_0} \int_{Y_1}^{Y_2} \int_{X_1}^{X_2} F(X, Y) dX\, dY$$

The maximum peak-to-valley height (P-V) can be expressed as a difference between the height of the highest peak $Z_{max}$ and the height of the lowest valley $Z_{min}$ at the specific surface, and can be obtained by the following formula.

$$P-V = Z_{max} - Z_{min}$$

The peak and the valley used herein are obtained by expanding into three dimensions the "peak" and the "valley" that are defined by JIS B 0601:2001 (ISO 4287:1997). The peak can be expressed as the highest point at the specific surface and the valley can be expressed as the lowest point at the specific surface.

The measurement conditions of the average surface roughness ($R_a$) and the maximum peak-to-valley height (P-V) in this example are described below.

Atomic force microscope (AFM): a scanning probe microscope SPI3800N/SPA500 manufactured by Seiko Instruments Inc.
Measurement mode: dynamic force mode (DFM)
Cantilever: SI-DF40 (made of silicon, a spring constant of 42N/m, a resonant frequency of 250 kHz to 390 kHz, and a probe tip of R≦10 nm)
Scanning speed: 1.0 Hz
Measured area: 10 μm×10 μm
Measured points: 256 points×256 points Note that DFM refers to a measurement mode in which the surface shape of a sample is measured in a state where a cantilever is resonated at a given frequency (a frequency specific to the cantilever) while the distance between a probe and the sample is controlled so that the vibration amplitude of the cantilever is maintained constant. In DFM, the surface of the sample and the cantilever are not in contact with each other; thus, measurement is possible without changing the original shape of the surface of the sample and without damaging the surface.

The measurement of the surface roughness of the glass substrate was performed under the above-described conditions. Treatment time was set to 0, 2, 3, 4, 5, and 6, minutes. Images of three-dimensional surface shapes of the glass substrate were obtained. In consideration of the curvature of a cross section of a substrate of each obtained measured image, all the data of the images were fitted for one-dimensional plane by a least-squares method with attached software to perform the first gradient correction for correcting the gradient in the plane, followed by the second gradient correction for correcting the quadratic curve. After that, the surface roughness was analyzed with the attached software, so that each of the average surface roughness ($R_a$) and the maximum peak-to-valley height (P-V) were calculated.

Figure 15:
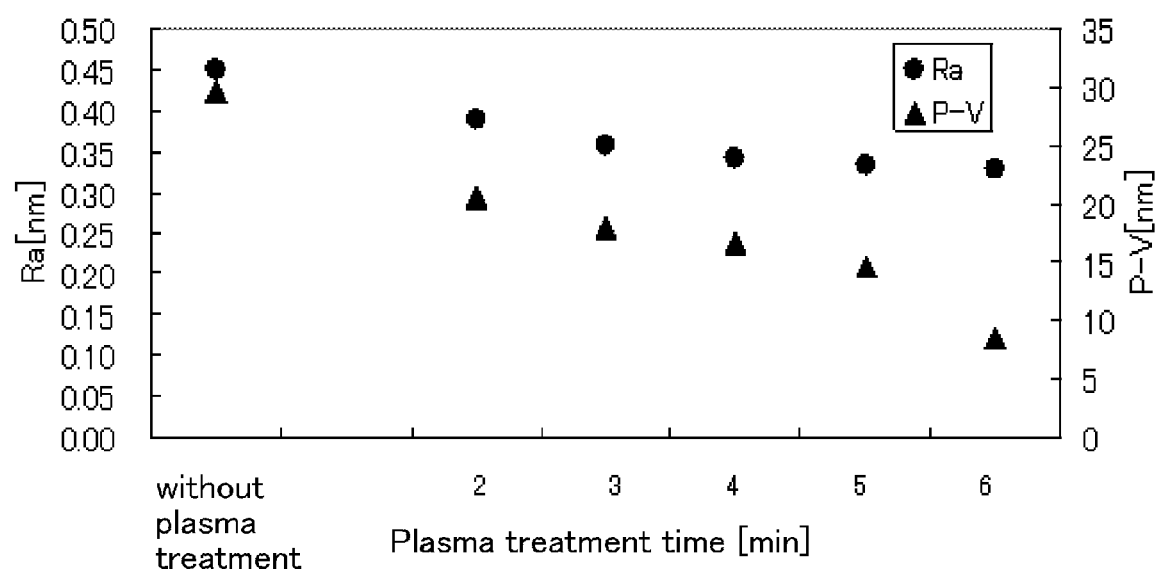
FIG. 15 is a graph illustrating a measurement result of surface roughness of a base substrate.

Table 1 and FIG. 15 show the average surface roughness ($R_a$) and the maximum peak-to-valley height (P-V), which were calculated. Note that treatment time of 0 min. is expressed as that plasma treatment is not performed in FIG. 15.

TABLE 1

| Treatment Time [min] | Average Surface Roughness Ra [nm] | Maximum Peak-to-valley Height P-V [nm] |
|---|---|---|
| 0 | 0.45 | 29.66 |
| 1 | — | — |
| 2 | 0.39 | 20.55 |
| 3 | 0.36 | 17.97 |
| 4 | 0.34 | 16.63 |
| 5 | 0.33 | 14.59 |
| 6 | 0.33 | 8.47 |

When plasma treatment was performed using an argon gas for 2 minutes, the surface roughness ($R_a$) on the surface of the glass substrate was reduced from 0.45 nm to 0.39 nm. When plasma treatment was performed using an argon gas for 6 minutes, the surface roughness ($R_a$) on the surface of the glass substrate was reduced down to 0.33 nm. The maximum peak-to-valley height (P-V) was 29.66 nm before plasma treatment. When the plasma treatment was performed for 6 minutes, the maximum peak-to-valley height (P-V) was reduced down to 8.47 nm. By performing plasma treatment, it was possible to reduce the surface roughness and the maximum peak-to-valley height on the surface of the glass substrate.

Example 2

In this example, measurement results of contact angles on a glass substrate subjected to plasma treatment are described.

Figure 16:
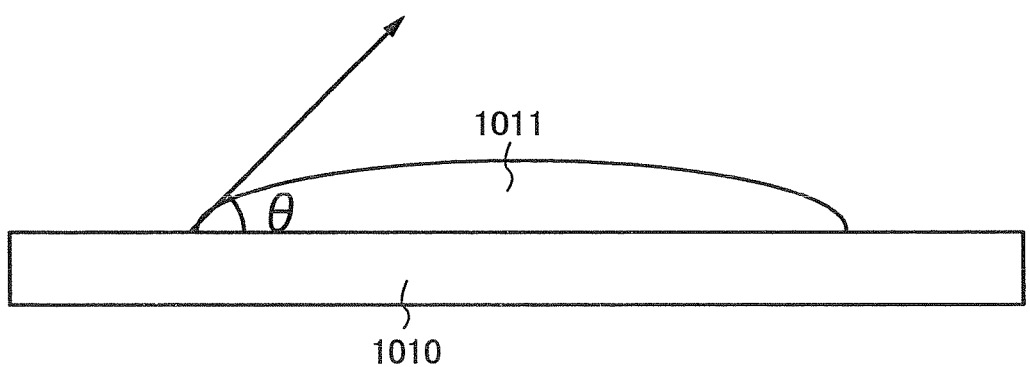
FIG. 16 is a cross-sectional view illustrating a contact angle θ.

First, Samples A, B, and C, which had been subjected to plasma treatment under different conditions, were prepared. And then, contact angles on surfaces of the Samples A, B, and C were measured. Note that the contact angle is an angle θ made by a formation surface and a tangent line of a liquid drop at an edge of dropped dots as illustrated in FIG. 16, and the smaller the contact angle is, the higher hydrophilicity the surface has.

The Sample A is a glass substrate which is not subjected to plasma treatment. The Samples B and C are glass substrates which are subjected to plasma treatment. The plasma treatment of the Sample B was performed using an apparatus manufactured by Tokyo Electron Limited (ME-500, an ICP plasma dry etching apparatus) by an ICP method under conditions with an ICP power of 500 W (0.11 W/cm$^2$), an RF bias voltage of 100 W (0.61 W/cm$^2$), a pressure of 1.35 Pa, and an argon gas flow rate of 100 sccm. Treatment time was set to 3 minutes. The plasma treatment of the Sample C was performed under similar conditions to those of the Sample B except that an Ar/O$_2$ gas flow rate is 100/20 sccm.

Figure 17A:
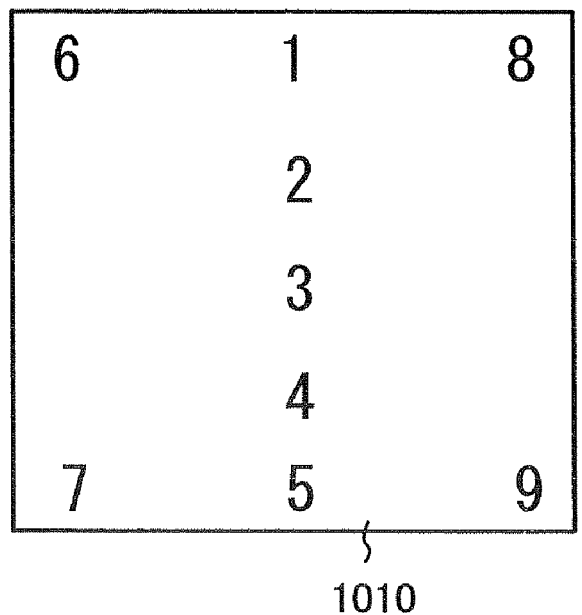
FIGS. 17A and 17B are diagrams illustrating a measurement location of a contact angle.

Next, contact angles with respect to water were measured using an apparatus for measuring contact angles. In measurement, an image was photographed at or after the time when water is dropped on a surface of a glass substrate 1010 using the apparatus for measuring contact angles in a direction of a cross-sectional observation. Here, an angle made by the surface of the glass substrate and a tangent line (an arrow) of a portion of an edge of a water droplet 1011 which is in contact with the surface of the glass substrate was measured as a contact angle θ as illustrated in FIG. 16. This measurement was performed at 9 points on a substrate surface (see FIG. 17A).

Table 2 shows measurement results of the contact angles on the glass substrates of the Samples A, B, and C.

TABLE 2

| | Contact Angle [°] | | |
|---|---|---|---|
| Point | Sample A | Sample B | Sample C |
| 1 | 5.32 | 4.00 | 4.30 |
| 2 | 10.41 | 4.00 | 4.52 |
| 3 | 31.03 | 4.00 | 4.00 |
| 4 | 6.05 | 4.00 | 4.00 |
| 5 | 6.57 | 4.00 | 4.00 |
| 6 | 11.35 | 4.69 | 5.22 |
| 7 | 10.55 | 4.00 | 5.00 |
| 8 | 9.51 | 5.68 | 5.63 |
| 9 | 7.08 | 4.21 | 7.17 |
| average | 10.87 | 4.29 | 4.87 |

As shown in Table 2, it was found that in the Sample A which is not subjected to plasma treatment, there is variation in the contact angles θ on the surface of the glass substrate. In contrast, the Samples B and C which are subjected to plasma treatment have less variation in the contact angles θ on the substrate surfaces than the Sample A.

Next, contact angles θ with a glass substrate which is not subjected to plasma treatment (Sample D), a glass substrate which is subjected to plasma treatment using an argon gas (Sample E), and a glass substrate which is subjected to plasma treatment using an argon gas and is cleaned after the plasma treatment (Sample F) were measured.

The Sample E was subjected to plasma treatment under similar conditions to those of the Sample B. The Sample F was subjected to plasma treatment under similar conditions to those of the Sample B and was cleaned after the plasma treatment.

Subsequently, contact angles with respect to water were measured using an apparatus for measuring contact angles. The measurement of the contact angles was performed in a similar manner to the Samples A, B, and C.

Table 3 shows measurement results of the contact angles on the glass substrates of the Samples D, E, and F. Note that the lower limit for measurement is 4° or less.

TABLE 3

| | Contact Angle [°] | | |
|---|---|---|---|
| Point | Sample D | Sample E | Sample F |
| 1 | 4.12 | 4.50 | 5.28 |
| 2 | 5.53 | 4.26 | 4.96 |
| 3 | 4.93 | 5.49 | 4.33 |
| 4 | 7.37 | 4.44 | 4.69 |
| 5 | 6.81 | 5.17 | 4.00 |
| 6 | 4.00 | 4.26 | 4.86 |
| 7 | 4.72 | 4.37 | 4.87 |
| 8 | 5.64 | 5.18 | 4.66 |
| 9 | 4.88 | 5.06 | 4.00 |
| average | 5.33 | 4.75 | 4.63 |

As shown in Table 3, in the Sample D which is not subjected to plasma treatment, there is variation in contact angles θ on the surface of the glass substrate. In addition, it was found that the Sample D has variation in contact angles θ between substrates as compared to the Sample A. In contrast, it was found that the Sample E which is subjected to plasma treatment has less variation in contact angles θ on the substrate surface than the Sample D. Further, it was found that the Sample E which is subjected to plasma treatment has also less variation in contact angles θ between substrates than the Sample B. Furthermore, it was found that the Sample F which is subjected to plasma treatment and is cleaned after the plasma treatment has also less variation in contact angles θ on the substrate surface than the Sample D.

Example 3

Next, results of surface energy measured to examine the bonding strength of an SOI substrate depending on performance of plasma treatment on a glass substrate are described.

First, three single crystal silicon substrates were prepared as semiconductor substrates. An oxide film was formed on each of the three single crystal silicon substrates by performing oxidation treatment in an oxidizing atmosphere including hydrogen chloride (HCl) at a ratio of 3 vol. % with respect to oxygen at a temperature of 950° C. for 200 minutes. Then, the three single crystal silicon substrates each provided with the oxide film were irradiated with hydrogen ions. The hydrogen ion irradiation was performed using an ion doping apparatus under conditions with a power source output of 100 W, an accelerating voltage of 40 kV, and a dose of 2.2×10$^{16}$ ions/cm$^3$.

Next, three glass substrates which are used as base substrates for being bonded to the single crystal silicon substrates were prepared. One of them is a glass substrate which is not subjected to plasma treatment. The other two are glass substrates which are subjected to plasma treatment. One glass substrate which is subjected to plasma treatment under similar conditions to those of the Sample B and the other glass substrate which is subjected to plasma treatment under similar conditions to those of the Sample C were prepared.

After all the substrates were cleaned, the glass substrates and the single crystal silicon substrates were bonded to each other. A sample in which the single crystal silicon substrate is bonded to the glass substrate which is not subjected to plasma treatment was a Sample G. A sample in which the single crystal silicon substrate is bonded to the glass substrate which is subjected to plasma treatment under similar conditions to those of the Sample B was a Sample H. A sample in which the single crystal silicon substrate is bonded to the glass substrate which is subjected to plasma treatment under similar conditions to those of the Sample C was a Sample I. Then, each of the bonded substrates was subjected to heat treatment at 200° C. for 2 hours.

Subsequently, surface energy was measured to examine the bonding strength of each of the bonded substrates. Measurement of surface energy was performed by a blade method.

The blade method is a method in which an oxide film formed over a first substrate 1200 (here, a single crystal silicon substrate) and a second substrate 1201 (here, a glass substrate) are bonded to each other and then a blade is inserted between the single crystal silicon substrate and the glass substrate, and surface energy (γ) is calculated based on a distance L between an end portion into which a blade 1205 is inserted and an interface 1204 where a crack 1203 is caused in accordance with the following formula.

$$\gamma = \frac{3t_b^2 E_1 t_{w1}^3 E_2 t_{w2}^3}{16L^4(E_1 t_{w1}^3 + E_2 t_{w2}^3)}$$

Figure 18:
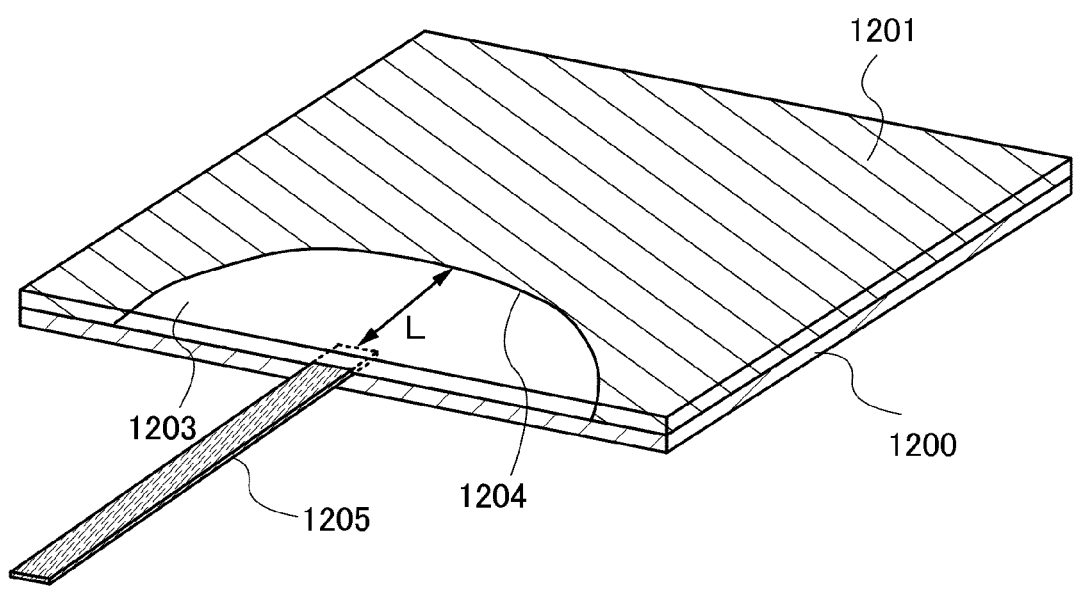
FIG. 18 is a diagram illustrating a blade method.

In the above formula, $t_b$ represents the thickness of the blade, $E_1$ represents Young's modulus of the first substrate, $E_2$ represents Young's modulus of the second substrate, $t_{w1}$ represents the thickness of the first substrate, $t_{w2}$ represents the thickness of the second substrate, and L represents the distance between an end of the blade and a crack interface (see FIG. 18). Note that in this example, the thickness of the blade $t_b$ is $2\times10^{-4}$ (m), Young's modulus of the first substrate $E_1$ is $1.3\times10^{11}$ Pa, Young's modulus of the second substrate $E_2$ is $7.7\times10^{10}$ Pa, the thickness of the first substrate $t_{w1}$ is 0.7 mm, and the thickness of the second substrate $t_{w2}$ is 0.7 mm.

After heat treatment, a blade was inserted between the single crystal silicon substrate and the glass substrate, and the distance L between an end portion into which the blade is inserted and an interface where a crack is caused was measured. The blade was inserted from one side of the substrate, and three minutes later after the blade was inserted, the distance L was measured. Measurement was performed by inserting the blade in an upper direction of the substrate, in a lower direction of the substrate, in a left direction of the substrate, and in a right direction of the substrate in this order. After the distance L was measured, surface energy was calculated by substituting values in the above formula. Table 4 shows measurement results of surface energy.

TABLE 4

| | | Distance [mm] | Surface Energy [mJ/m²] | Average Surface Energy [mJ/m²] |
|---|---|---|---|---|
| Sample G | upper | — | — | — |
| | left | — | — | |
| | lower | — | — | |
| | right | — | — | |
| Sample H | upper | 20.64 | 685 | 703 |
| | left | 20.45 | 711 | |
| | lower | 20.50 | 704 | |
| | right | 20.46 | 710 | |
| Sample I | upper | 20.07 | 315 | 408 |
| | left | 22.69 | 469 | |
| | lower | 23.32 | 421 | |
| | right | 23.21 | 429 | |

The single crystal silicon substrate was not able to be bonded to the glass substrate which is not subjected to plasma treatment because spontaneous bonding did not occur. Thus, surface energy was not able to be obtained. In contrast, the single crystal silicon substrate was able to be favorably bonded to the base substrate which is subjected to plasma treatment because projections of the base substrate were preferentially etched by sputtering by the plasma treatment; thus, the projections were planarized. When plasma treatment was performed using an argon gas, surface energy was 703 mJ/m². When plasma treatment was performed using an argon gas and an oxygen gas, surface energy was 408 mJ/m². From these results, it was found that performance of plasma treatment using an argon gas makes it possible to obtain higher surface energy.

Example 4

In this example, results of examination on how unevenness on a glass substrate surface is planarized by plasma treatment are described.

There is a difficulty in directly observing planarization by plasma treatment because the height difference between the top of the projection and the bottom of the depression on a glass substrate surface is several nm. Therefore, in this example, unevenness is intentionally formed on the glass substrate in order to observe it.

A Sample J which is used in this example is described. First, a silicon nitride film (50 nm) and a silicon oxide film (200 nm) were deposited over the glass substrate in this order. Then, a so-called line-and-space pattern was formed and line-and-space patterned unevenness was formed on the silicon oxide film by dry etching. The Sample J was subjected to plasma treatment using an argon gas, and a cross-sectional observation was performed with a scanning transmission electron microscope (STEM) before and after the plasma treatment.

Plasma treatment was performed using an apparatus manufactured by Tokyo Electron Limited (ME-500, an ICP plasma dry etching apparatus) by an ICP method under conditions with an ICP power of 500 W (0.11 W/cm²), an RF bias voltage of 100 W (0.61 W/cm²), a pressure of 1.35 Pa, and an argon gas flow rate of 100 sccm. Treatment time was set to 3 minutes.

Figure 19A:
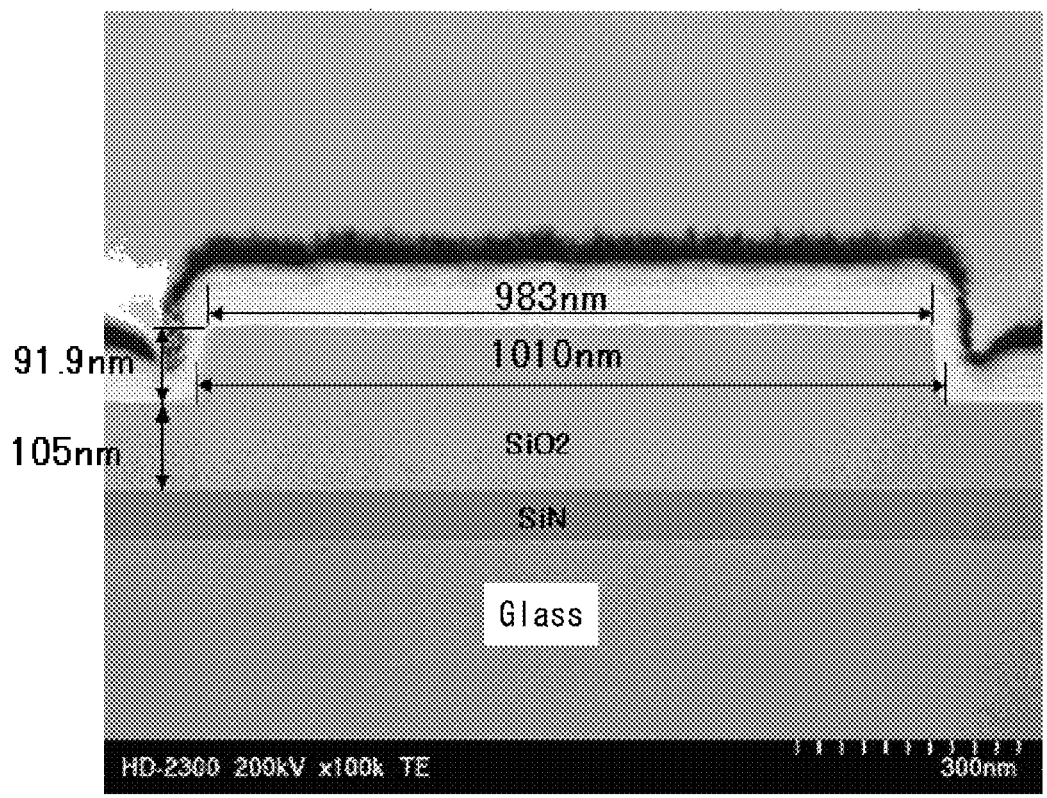
FIGS. 19A and 19B are cross-sectional STEM images.
Figure 19B:
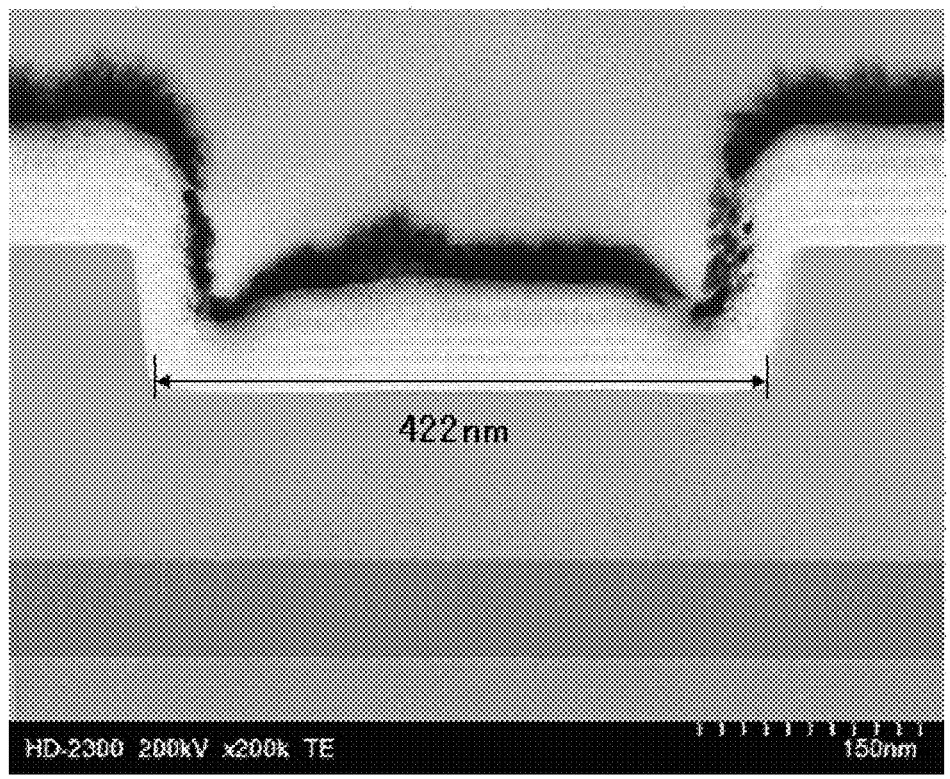
Figure 20A:
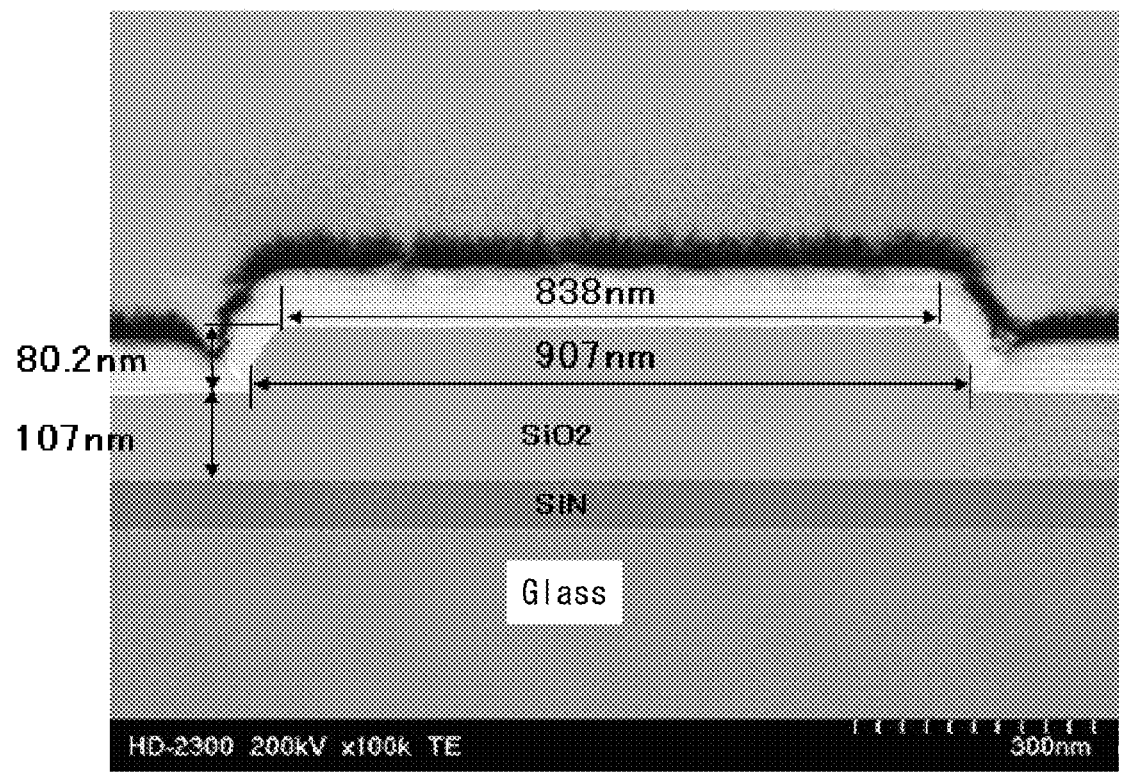
FIGS. 20A and 20B are cross-sectional STEM images.
Figure 20B:
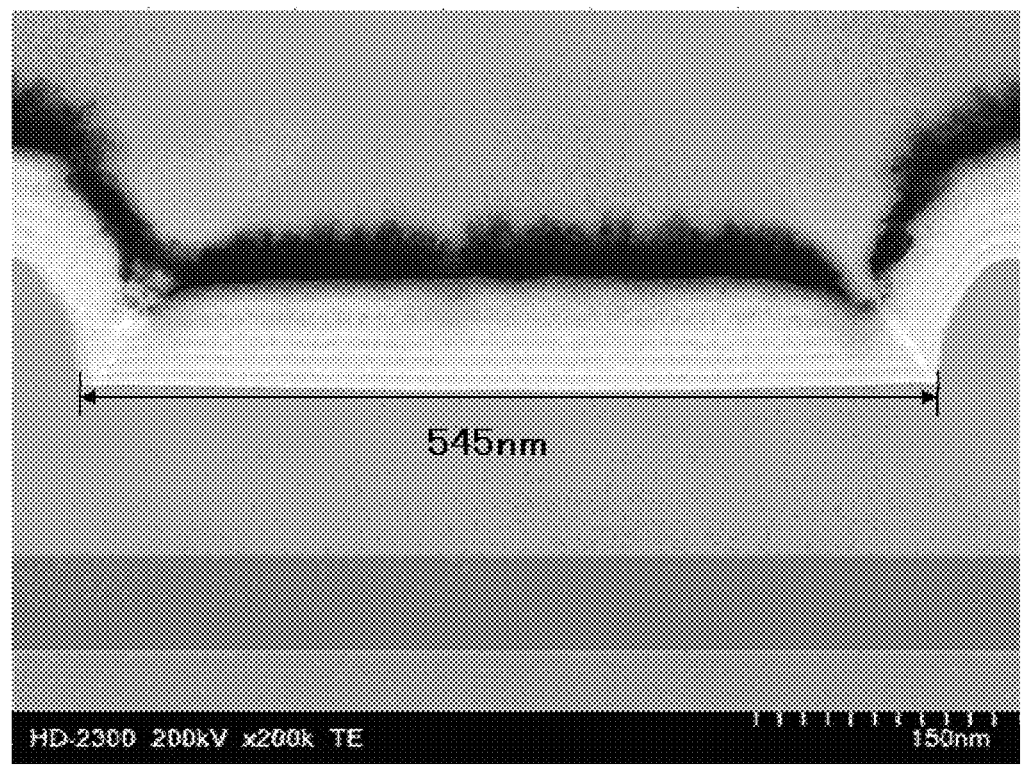

FIGS. 19A and 19B and FIGS. 20A and 20B are STEM images before and after plasma treatment. FIG. 19A is an image showing a line before plasma treatment, and FIG. 19B is an image showing a space before plasma treatment. FIG. 20A is an image showing a line after plasma treatment, and FIG. 20B is an image showing a space after plasma treatment.

While the length of a line (a projection) before plasma treatment was 1010 nm as shown in FIG. 19A, the length of the line after plasma treatment was reduced by about 100 nm, down to 907 nm, as shown in FIG. 20A. In addition, while the height of the projection before plasma treatment was 91.9 nm, the height of the projection after plasma treatment was reduced by about 10 nm, down to 80.2 nm.

Moreover, while the length of a space before plasma treatment was 422 nm as shown in FIG. 19B, the length of the space after plasma treatment was increased by about 100 nm, up to 545 nm, as shown in FIG. 20B. As for the thickness of the silicon oxide film in the space, the reduction in film thickness was not able to be observed.

Further, as shown in FIG. 20A, it was observed that an upper end portion of the projection was etched to have a curved shape by plasma treatment.

It was found that by performing plasma treatment using an argon gas, the etching rate of the upper end portion of the projection becomes higher as compared to a lower end portion (a space) of the projection, and as a result, the height of the projection is reduced. In addition, it was also found that the upper end portion of the projection was etched to have a curved shape. That is, a phenomenon was confirmed in which the upper end portion is preferentially etched while the lower end portion is hardly changed.

Figure 21:
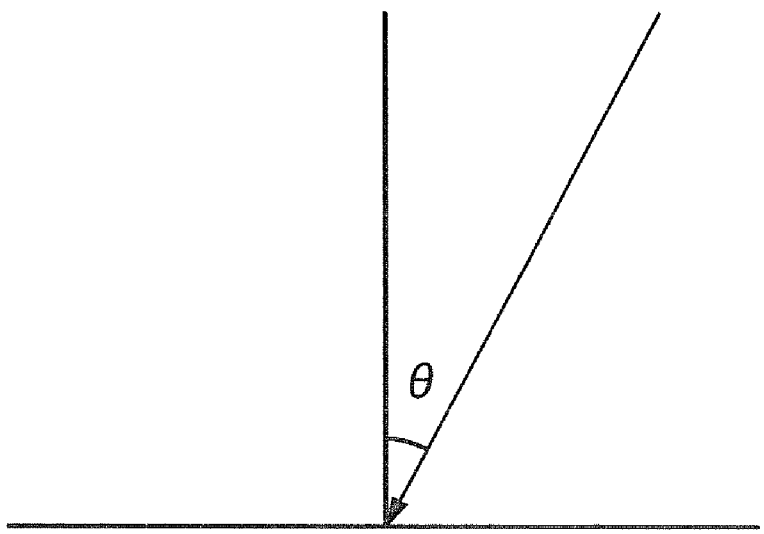
FIG. 21 is a diagram illustrating an ion incidence angle with respect to a substrate.

This etching mechanism can be explained by the dependence of an ion incident angle. The larger an ion incident angle θ (FIG. 21) with respect to the silicon oxide film is, the higher the sputtering rate of the silicon oxide film is. Accordingly, the etching rate becomes higher. On the other hand, the smaller the ion incident angle (for example, 0°) is, the lower the sputtering rate of the silicon oxide film is. Accordingly, the etching rate becomes lower. Therefore, it was considered that the ion incident angle at an upper end portion of the silicon oxide film is likely larger; thus, the etching rate is higher.

From the above results, it was considered that also in the glass substrate in which the height difference between the top of the projection and the bottom of the depression is several nm, the etching rate of the upper end portion of the projection is higher than that of the lower end portion of the projection. As a result, it was considered that height of the projection (the maximum peak-to-valley height (P-V)) is reduced and surface roughness (the average surface roughness ($R_a$)) of the glass substrate is reduced.

Example 5

In this example, changes in surface characteristics when a surface of a nitrogen-containing layer formed over a base substrate is subjected to plasma treatment are described. In this example, a glass substrate is used as a base substrate, and a silicon nitride oxide film is used as a nitrogen-containing layer.

First, a silicon nitride oxide film (the thickness is 50 nm) was formed over a glass substrate by a CVD method. Next, a surface of the silicon nitride oxide film was subjected to plasma treatment with different treatment time in order to measure the surface roughness of the silicon nitride oxide film. The plasma treatment was performed using an apparatus manufactured by Tokyo Electron Limited (ME-500, an ICP plasma dry etching apparatus) by an ICP method under conditions with an ICP power of 1000 W (0.25 W/cm$^2$), an RF bias voltage of 50 W (0.03 W/cm$^2$), a pressure of 1.35 Pa, an argon gas flow rate of 100 sccm, and a temperature of a lower electrode of −10° C. Treatment time was set to 0, 1, 3, 5, 7, and 9 minutes (see FIG. 23).

In this example, the average surface roughness ($R_a$) and the maximum peak-to-valley height (P-V) of the silicon nitride oxide film was measured with an atomic force microscope.

Measurement conditions and calculation methods of the average surface roughness ($R_a$) and the maximum peak-to-valley height (P-V) in this example are similar to those in Example 1; thus, specific description thereof is omitted.

Figure 23:
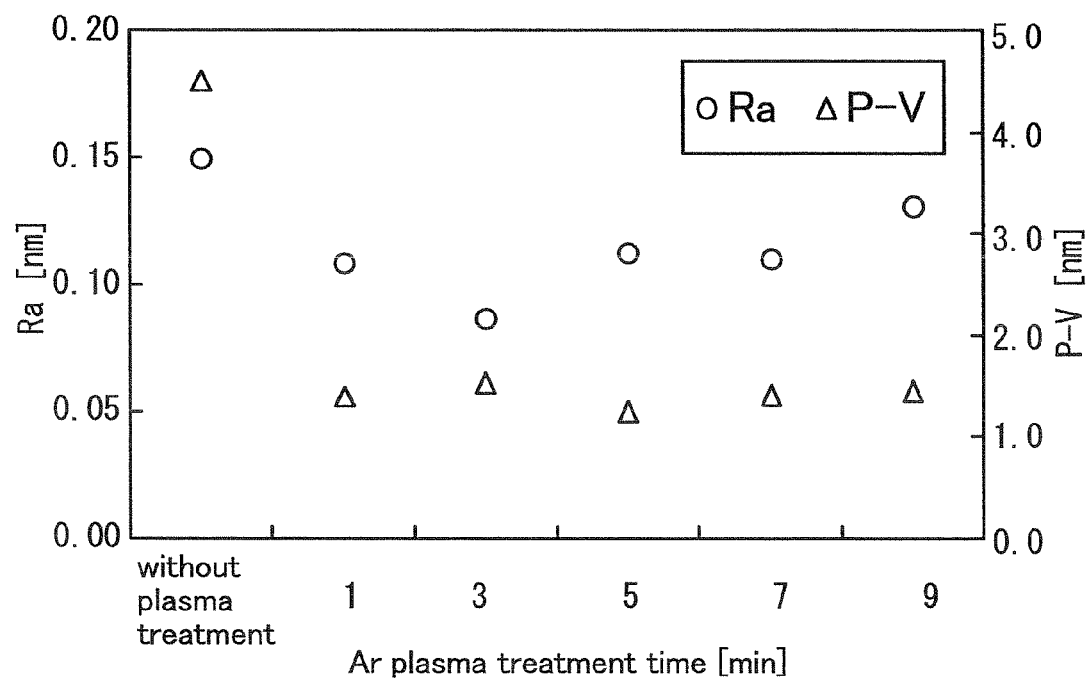
FIG. 23 is a graph illustrating a measurement result of surface roughness of a nitrogen-containing layer.

Table 5 and FIG. 23 show the average surface roughness $R_a$ and the maximum peak-to-valley height P-V, which were calculated. Note that the average surface roughness is represented by a white circle, and the maximum peak-to-valley height is represented by a white triangle. In FIG. 23, treatment time of 0 min. is expressed as that plasma treatment is not performed.

TABLE 5

| Treatment Time [min] | Average Surface Roughness Ra [nm] | Maximum Peak-to-valley Height P-V [nm] |
| --- | --- | --- |
| 0 | 0.15 | 4.50 |
| 1 | 0.11 | 1.39 |
| 3 | 0.09 | 1.54 |
| 5 | 0.11 | 1.25 |
| 7 | 0.11 | 1.41 |
| 9 | 0.13 | 1.44 |

In Table 5 and FIG. 23, in the case of conditions in which plasma treatment is not performed, the average surface roughness ($R_a$) was 0.15 nm and the maximum peak-to-valley height (P-V) was 4.50 nm. By performing plasma treatment for 1 minute, the average surface roughness ($R_a$) was able to be reduced to 0.11 nm and the maximum peak-to-valley height (P-V) was able to be reduced to 1.39 nm. In addition, when plasma treatment is performed for 3, 5, 7, and 9 minutes, the average surface roughness ($R_a$) and the maximum peak-to-valley height (P-V) were able to be reduced as compared to the case where plasma treatment is not performed. From these results, it was found that by performing plasma treatment on the surface of the nitrogen-containing layer formed over the base substrate, planarity of the surface of the nitrogen-containing layer can be improved.

Next, measurement results of contact angles when silicon nitride oxide films are subjected to plasma treatment are described.

First, four samples were prepared in each of which a silicon nitride oxide film (the thickness is 50 nm) is formed over a glass substrate by a CVD method. Three samples of the four samples were subjected to plasma treatment. The plasma treatment was performed under conditions with an ICP power of 1000 W (0.25 W/cm$^2$), an RF bias voltage of 50 W (0.03 W/cm$^2$), a pressure of 1.35 Pa, an argon gas flow rate of 100 sccm, and a temperature of a lower electrode of −10° C. Treatment time was set to 3, 6, and 9 minutes. A sample subjected to treatment for 3 minutes was a Sample L. A sample subjected to treatment for 6 minutes was a Sample M. A sample subjected to treatment for 9 minutes was a Sample N. A sample which is not subjected to plasma treatment was a Sample K.

Figure 17B:
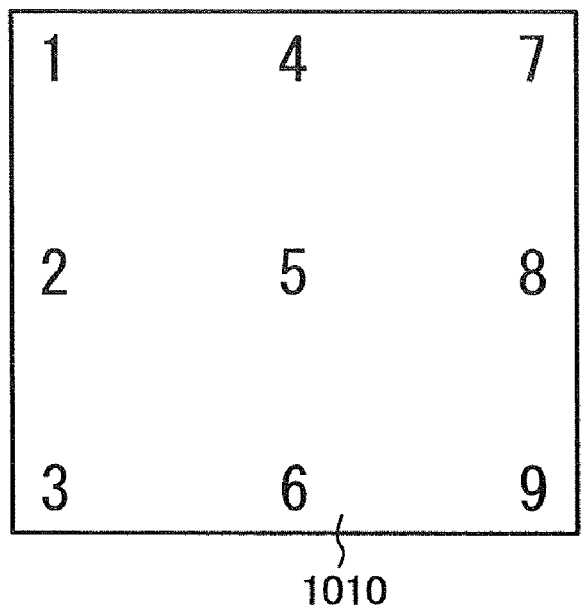

Next, in a similar manner to Example 2, contact angles with respect to water were measured by using an apparatus for measuring contact angles. In measurement, an image in which at or after the time when water is dropped on a surface of a silicon nitride oxide film using an apparatus for measuring contact angles was photographed in a direction of a cross-sectional observation. Here, an angle made by the surface of the silicon nitride oxide film and a tangent line (an arrow) of a portion of an edge of the water droplet 1011 which is in contact with the surface of the silicon nitride oxide film was measured as a contact angle θ. This measurement was performed at 9 points on a substrate surface (see FIG. 17B).

Table 6 shows measurement results of the contact angles of the silicon nitride oxide films in the Samples K, L, M, and N.

TABLE 6

| | Contact Angle [°] | | | |
|---|---|---|---|---|
| Point | Sample K | Sample L | Sample M | Sample N |
| 1 | 59.9 | 19.7 | 23.2 | 30.2 |
| 2 | 66.5 | 26.3 | 36.0 | 35.7 |
| 3 | 64.4 | 28.4 | 31.1 | 31.4 |
| 4 | 63.4 | 23.0 | 27.1 | 29.3 |
| 5 | 62.0 | 22.5 | 32.1 | 35.0 |
| 6 | 65.4 | 30.0 | 40.9 | 37.7 |
| 7 | 57.8 | 22.8 | 26.0 | 27.7 |
| 8 | 65.9 | 24.7 | 34.4 | 36.3 |
| 9 | 59.2 | 27.2 | 29.6 | 24.5 |
| average | 62.7 | 24.9 | 31.1 | 32.0 |

As shown in Table 6, an average contact angle on a substrate surface of the Sample K which is not subjected to plasma treatment was 62.7°. In contrast, averages on substrate surfaces of the Samples L, M, and N which are subjected to plasma treatment were 24.9°, 31.1°, 32.0°, respectively. The contact angles of the Samples L, M, and N were able to be made small as compared to the Sample K which is not subjected to plasma treatment.

Next, results of surface energy measured to examine the bonding strength of an SOI substrate depending on performance of plasma treatment on a silicon nitride oxide film are described.

First, four single crystal silicon substrates were prepared as semiconductor substrates. An oxide film was formed on each of the four single crystal silicon substrates by performing oxidation treatment in an oxidizing atmosphere including hydrogen chloride (HCl) at a ratio of 3 vol. % with respect to oxygen at a temperature of 950° C. for 200 minutes. Then, the four single crystal silicon substrates each provided with the oxide film was irradiated with hydrogen ions. The hydrogen ion irradiation was performed using an ion doping apparatus under conditions with a power source output of 100 W, an accelerating voltage of 40 kV, and a dose of $2.2 \times 10^{16}$ ions/cm$^3$.

Next, four glass substrates which are used as base substrates for being bonded to the single crystal silicon substrates were prepared. A silicon nitride oxide film (the thickness is 50 nm) was formed on each of the four glass substrates. Next, three substrates of the four substrates were subjected to plasma treatment. The plasma treatment was performed under conditions with an ICP power of 1000 W (0.25 W/cm$^2$), an RF bias voltage of 50 W (0.03 W/cm$^2$), a pressure of 1.35 Pa, an argon gas flow rate of 100 sccm, and a temperature of a lower electrode of −10° C. Treatment time was set to 3, 6, and 9 minutes. The other one substrate was not subjected to plasma treatment.

After all the substrates were cleaned, the glass substrates and the single crystal silicon substrates were bonded to each other with the silicon nitride oxide films interposed therebetween. A sample in which the single crystal silicon substrate is bonded to the silicon nitride oxide film which is not subjected to plasma treatment was a Sample O. A sample in which the single crystal silicon substrate is bonded to the silicon nitride oxide film which is subjected to plasma treatment for 3 minutes was a Sample P. A sample in which the single crystal silicon substrate is bonded to the silicon nitride oxide film which is subjected to plasma treatment for 6 minutes was a Sample Q. A sample in which the single crystal silicon substrate is bonded to the silicon nitride oxide film which is subjected to plasma treatment for 9 minutes was a Sample R. Then, each of the bonded substrates was subjected to heat treatment at 200° C. for 2 hours.

Subsequently, surface energy was measured to examine the bonding strength of each of the bonded substrates. Measurement of surface energy was performed by a blade method under similar conditions to those of Example 3.

After heat treatment, a blade was inserted between the single crystal silicon substrate and the silicon nitride oxide film and the distance L between an end portion into which the blade is inserted and an interface where a crack is caused was measured. The blade was inserted from one side of the substrate, and three minutes later after the blade was inserted, the distance L was measured. Measurement was performed by inserting the blade in an upper direction of the substrate, in a lower direction of the substrate, in a left direction of the substrate, and in a right direction of the substrate in this order. After the distance L was measured, surface energy was calculated by substituting values in the above formula. Table 7 shows measurement results of surface energy. Note that in Table 7, a straight line means that the bonding strength between the single crystal silicon substrate and the silicon nitride oxide film was so strong that the glass substrate was not able to stand the bonding strength and was broken when the blade was inserted between the single crystal silicon substrate and the silicon nitride oxide film.

TABLE 7

| | | Distance [mm] | Surface Energy [mJ/m$^2$] | Average Surface Energy [mJ/m$^2$] |
|---|---|---|---|---|
| Sample O | upper | 19.95 | 785 | 782.5 |
| | left | 19.79 | 811 | |
| | lower | 19.97 | 782 | |
| | right | 20.17 | 752 | |
| Sample P | upper | broken | — | 1172 |
| | left | 18.13 | 1151 | |
| | lower | 17.97 | 1193 | |
| | right | broken | — | |
| Sample Q | upper | 18.42 | 1081 | 1038 |
| | left | 18.39 | 1088 | |
| | lower | 18.77 | 1002 | |
| | right | 18.87 | 981 | |
| Sample R | upper | 19.39 | 880 | 908.0 |
| | left | 18.84 | 987 | |
| | lower | 19.13 | 929 | |
| | right | 19.64 | 836 | |

As shown in Table 7, when plasma treatment was not performed, surface energy was 782.5 mJ/m$^2$; when plasma treatment was performed, surface energy was 1172 mJ/m$^2$, 1038 mJ/m$^2$, and 908.0 mJ/m$^2$. From these results, it was found that performance of plasma treatment makes it possible to improve surface energy.

Next, after the silicon nitride oxide film formed over the glass substrate is subjected to plasma treatment, a surface state of the silicon nitride oxide film was examined on the kind, the number, and the chemical bonding state of elements present on the surface of the silicon nitride oxide film by X-ray photoelectron spectroscopy (XPS).

Samples used in this example are described. First, a silicon nitride oxide film (the thickness is 50 nm) was formed over a glass substrate by a CVD method. A Sample S was made in such a manner.

Next, a sample was prepared in which a silicon nitride oxide film (the thickness is 50 nm) which is formed over a glass substrate in a similar manner to the Sample S is subjected to plasma treatment. The plasma treatment was performed under conditions with an ICP power of 1000 W (0.25 W/cm$^2$), an RF bias voltage of 50 W (0.03 W/cm$^2$), a pressure of 1.35 Pa, an argon gas flow rate of 100 sccm, and a temperature of a lower electrode of −10° C. Treatment time was set to 3 minutes. Through the above steps, a Sample T was obtained.

Figure 24:
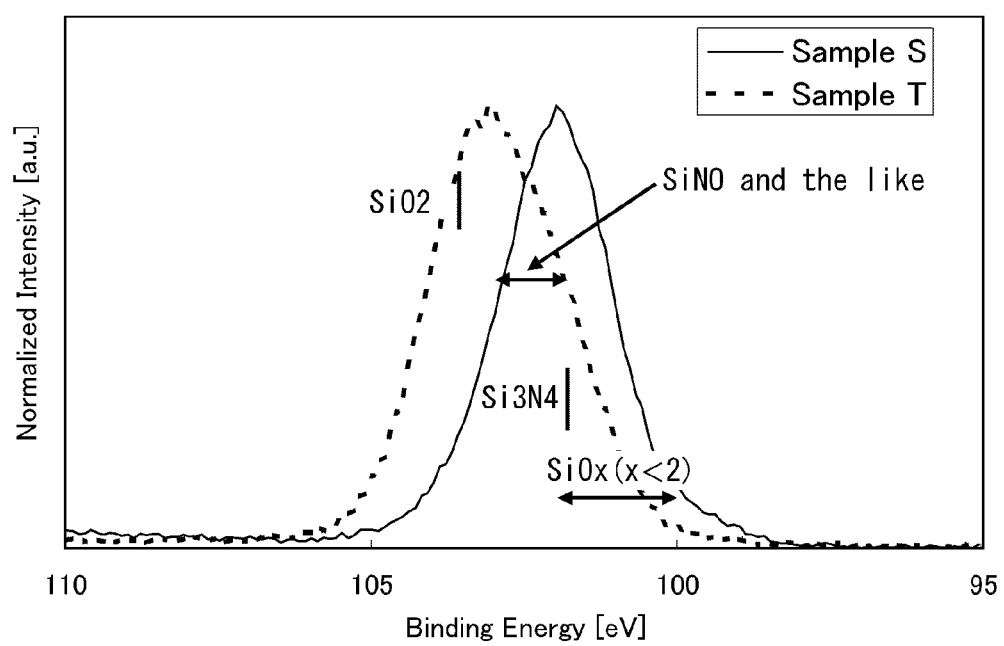
FIG. 24 is a graph illustrating XPS of Samples S and T.

Then, a surface of the Sample S and a surface of the Sample T were measured by XPS. FIG. 24 illustrates measurement results of electrons in the 2p orbit of silicon of the Sample S and the Sample T. The horizontal axis indicates binding energy [eV], and the vertical axis indicates strength (relative units). A solid line indicates a photoelectron spectrum of the Sample S, and a dotted line indicates a photoelectron spectrum of the Sample T. Further, the strength is normalized in both the spectra. Furthermore, Table 8 shows a bonding state in which a peak appears in the 2p orbit of silicon and a binding energy value. By examination of an energy state from an XPS spectrum of electrons in the 2p orbit of silicon, silicon compounds which exist can be specified.

TABLE 8

| Bonding State | Binding Energy [eV] |
|---|---|
| $Si_3N_4$ | 101.7 |
| SiNO etc | 101.5~103 |
| $SiO_x(x<2)$ | 100~102 |
| $SiO_2$ | 103~103.6 |

As illustrated in FIG. 24, in a spectrum of the Sample S, a peak was observed in the vicinity of 102 eV and corresponds with binding energy of SiNO and the like. Further, in a spectrum of the Sample T, a peak was observed in the vicinity of 103 eV and corresponds with binding energy of $SiO_2$. From these facts, it was found that by performing plasma treatment on the silicon nitride oxide film, the number of SiNO components on the surface of the silicon nitride oxide film is reduced and the number of $SiO_2$ components on the surface of the silicon nitride oxide film is increased.

From the above results, it was confirmed that by performing plasma treatment on the silicon nitride oxide film, the number of $SiO_2$ components on the surface of the silicon nitride oxide film is increased. It was considered that by increase in the number of $SiO_2$ components on the surface of the silicon nitride oxide film, hydrophilicity of the surface of the silicon nitride oxide film is improved. As a result, it was considered that the bonding strength between the silicon nitride oxide film formed over the glass substrate and the oxide film formed on the semiconductor substrate can be improved. Moreover, it was also considered that performance of plasma treatment makes it possible to planarize the surface of the silicon nitride oxide film; thus, the bonding strength can be improved.

Example 6

In this example, measurement results of the number of defects on a bonding interface between a semiconductor substrate and a base substrate is described.

As Conditions 1, a single crystal silicon substrate was prepared as a semiconductor substrate, and a glass substrate was prepared as a base substrate. A silicon oxide film with a thickness of about 100 nm was formed on the single crystal silicon substrate by thermal oxidation treatment in an oxidizing atmosphere to which chlorine is added and then an embrittled region was formed in the single crystal silicon substrate by hydrogen ion irradiation. Subsequently, the single crystal silicon substrate was subjected to cleaning treatment. For the cleaning treatment, carbonated water was used.

Next, before bonding, the single crystal silicon substrate and the glass substrate were subjected to cleaning treatment. For the cleaning treatment, carbonated water was used. Then, the single crystal silicon substrate and the glass substrate were bonded to each other. Subsequently, heat treatment was performed to separate the bonded substrates into the glass substrate provided with a single crystal silicon layer and the single crystal silicon substrate. As Samples 1 to 4, four glass substrates each provided with a single crystal silicon layer were prepared.

As Conditions 2, a single crystal silicon substrate was prepared as a semiconductor substrate, and a glass substrate was prepared as a base substrate. A silicon oxide film with a thickness of about 100 nm was formed on the single crystal silicon substrate by thermal oxidation treatment in an oxidizing atmosphere to which chlorine is added and then an embrittled region was formed in the single crystal silicon substrate by hydrogen ion irradiation. Subsequently, the single crystal silicon substrate was subjected to UV ozone treatment. The UV ozone treatment was performed by irradiation with a low-pressure mercury lamp in an air atmosphere.

Next, before bonding, the single crystal silicon substrate and the glass substrate were subjected to cleaning treatment. For the cleaning treatment, carbonated water and ozone water was used. Then, the single crystal silicon substrate and the glass substrate were bonded to each other. Subsequently, heat treatment was performed to separate the bonded substrates into the glass substrate provided with a single crystal silicon layer and the single crystal silicon substrate. As Samples 5 to 9, five glass substrates each provided with a single crystal silicon layer were prepared.

After that, the single crystal silicon layers which are provided over each of the glass substrates manufactured under the Conditions 1 and 2 were observed by a dust inspecting apparatus (a glass substrate surface inspecting apparatus GI-4600 manufactured by Hitachi Engineering Corporation). Table 9 and Table 10 show the number of defects observed by the dust inspecting apparatus. Table 9 shows a result of the sample made under Conditions 1. Table 10 shows a result of the sample made under Conditions 2.

TABLE 9

| Sample No. | number of defects (per 107 mm□) |
|---|---|
| 1 | 3749 |
| 2 | 4209 |
| 3 | 1841 |
| 4 | 41 |

TABLE 10

| Sample No. | number of defects (per 107 mm□) |
|---|---|
| 5 | 19 |
| 6 | 16 |
| 7 | 16 |
| 8 | 14 |
| 9 | 17 |

In the sample made under Conditions 1 shown in Table 9, there were a larger number of defects in the sample and there was also a lot of variation in the number of defects between the samples. It was considered that in the sample made under Conditions 1, water spots are left on the single crystal silicon substrate after being dried after carbonated water cleaning. As a result, it was considered that the number of defective bonding is increased. In contrast, in the sample made under Conditions 2 shown in Table 10, defects were hardly detected and favorable bonding was able to be obtained. In the sample made under Conditions 2, by performing UV ozone treatment, an organic substance or the like attached to the surface of the single crystal silicon substrate was able to be oxidatively decomposed and removed. Thus, it was considered that the surface of the single crystal silicon substrate has hydrophilicity and generation of water spots after being dried after carbonated water cleaning can be suppressed. As a result, it was considered that generation of defective bonding can be suppressed.

This application is based on Japanese Patent Application serial no. 2008-189015 filed with Japan Patent Office on Jul. 22, 2008, the entire contents of which are hereby incorporated by reference.

What is claimed is:

1. A method for manufacturing an SOI substrate comprising:
    planarizing a surface of a base substrate by performing a first plasma treatment on the base substrate;
    forming an oxide film over a semiconductor substrate;
    irradiating the semiconductor substrate with ions through the oxide film to form an embrittled region at a predetermined depth from a surface of the semiconductor substrate;
    performing a second plasma treatment on the oxide film;
    bonding a surface of the oxide film and the planarized surface of the base substrate to each other; and
    separating the semiconductor substrate along the embrittled region to form a semiconductor layer over the base substrate with the oxide film interposed therebetween.

2. The method for manufacturing an SOI substrate according to claim 1,
    wherein at least one of the first plasma treatment and the second plasma treatment is performed in a state in which a bias voltage is applied.

3. The method for manufacturing an SOI substrate according to claim 1,
    wherein at least one of the first plasma treatment and the second plasma treatment is performed by inductively coupled plasma etching.

4. The method for manufacturing an SOI substrate according to claim 1,
    wherein the oxide film is formed by performing a thermal oxidation treatment on the semiconductor substrate in an oxidizing atmosphere containing hydrogen chloride or trans-1,2-dichloroethylene.

5. The method for manufacturing an SOI substrate according to claim 1,
    wherein contact angle on the surface of the base substrate after the first plasma treatment with respect to water is 5° or less.

6. The method for manufacturing an SOI substrate according to claim 1,
    wherein the base substrate is a glass substrate.

7. The method for manufacturing an SOI substrate according to claim 1,
    wherein the irradiating step is performed by using an ion doping apparatus.

8. The method for manufacturing an SOI substrate according to claim 1,
    wherein the ions contain $H_3^+$ ions.

9. A method for manufacturing an SOI substrate comprising:
    planarizing a surface of a base substrate by performing a first plasma treatment on the base substrate;
    forming an oxide film over each of a plurality of semiconductor substrates;
    irradiating the plurality of semiconductor substrates with ions through the oxide films to form an embrittled region at a predetermined depth from each surface of the plurality of semiconductor substrates;
    performing a second plasma treatment on the oxide films;
    bonding surfaces of the oxide films and the planarized surface of the base substrate to each other; and
    separating the plurality of semiconductor substrates along the embrittled regions to form a plurality of semiconductor layers over the base substrate with the oxide film interposed therebetween.

10. The method for manufacturing an SOI substrate according to claim 9,
    wherein at least one of the first plasma treatment and the second plasma treatment is performed in a state in which a bias voltage is applied.

11. The method for manufacturing an SOI substrate according to claim 9,
    wherein at least one of the first plasma treatment and the second plasma treatment is performed by inductively coupled plasma etching.

12. The method for manufacturing an SOI substrate according to claim 9,
    wherein the oxide films are formed by performing a thermal oxidation treatment on the plurality of semiconductor substrates in an oxidizing atmosphere containing hydrogen chloride or trans-1,2-dichloroethylene.

13. The method for manufacturing an SOI substrate according to claim 9,
    wherein contact angle on the surface of the base substrate after the first plasma treatment with respect to water is 5° or less.

14. The method for manufacturing an SOI substrate according to claim 9,
    wherein the base substrate is a glass substrate.

15. The method for manufacturing an SOI substrate according to claim 9,
    wherein the irradiating step is performed by using an ion doping apparatus.

16. The method for manufacturing an SOI substrate according to claim 9,
    wherein the ions contain $H_3^+$ ions.

* * * * *